US012663726B2

(12) United States Patent
Conley et al.

(10) Patent No.: US 12,663,726 B2
(45) Date of Patent: Jun. 23, 2026

(54) OPTIMIZATION OF LITHOGRAPHIC PROCESS BASED ON BANDWIDTH AND SPECKLE

(71) Applicants:ASML NETHERLANDS B.V., Veldhoven (NL); Cymer, LLC, San Diego, CA (US)

(72) Inventors: Willard Earl Conley, San Diego, CA (US); Duan-Fu Stephen Hsu, Fremont, CA (US); Joshua Jon Thornes, San Diego, CA (US); Johannes Jacobus Matheus Baselmans, Oirschot (NL)

(73) Assignees: ASML NETHERLANDS B.V., Veldhoven (NL); CYMER, LLC, San Diego, CA (US)

( * ) Notice: Subject to any disclaimer, the term of this patent is extended or adjusted under 35 U.S.C. 154(b) by 267 days.

(21) Appl. No.: 18/266,246

(22) PCT Filed: Dec. 9, 2021

(86) PCT No.: PCT/EP2021/084967
§ 371 (c)(1),
(2) Date: Jun. 8, 2023

(87) PCT Pub. No.: WO2022/135953
PCT Pub. Date: Jun. 30, 2022

(65) Prior Publication Data
US 2024/0045341 A1 Feb. 8, 2024

Related U.S. Application Data

(60) Provisional application No. 63/129,957, filed on Dec. 23, 2020.

(51) Int. Cl.
*G03F 7/00* (2006.01)
*G03F 7/20* (2006.01)

(52) U.S. Cl.
CPC ........ *G03F 7/70575* (2013.01); *G03F 7/2004* (2013.01); *G03F 7/70025* (2013.01); *G03F 7/70583* (2013.01)

(58) Field of Classification Search
CPC .... G03F 7/2004; G03F 7/70025; G03F 7/705; G03F 7/70575; G03F 7/70583
See application file for complete search history.

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

TW 201939172 10/2019
WO 2017/102321 6/2007
WO 2017/102350 6/2007

OTHER PUBLICATIONS

International Search Report and Written Opinion issued in corresponding International Application No. PCT/EP2021/084967, dated Mar. 18, 2022.
(Continued)

*Primary Examiner* — Peter B Kim
(74) *Attorney, Agent, or Firm* — Pillsbury Winthrop Shaw Pittman, LLP

(57) ABSTRACT
A method for improving a lithographic process of imaging a portion of a design layout onto a substrate using a lithographic apparatus. The method includes computing a multi-variable cost function that is a function of: (i) a plurality of design variables that affect characteristics of the lithographic process and (ii) a radiation bandwidth of a radiation source of the lithographic apparatus; and reconfiguring one or more of the characteristics (e.g., EPE, image contrast, resist, etc.) of the lithographic process by adjusting one or more of the design variables (e.g., source, mask
(Continued)

NILS

Speckle Contrast          ——■—— 40p80 NILS layout, bandwidth, etc.) until a termination condition is satisfied. The termination condition includes a speckle characteristic (e.g., a speckle contrast) maintained within a speckle specification associated with the radiation source and also maintaining an image contrast associated with the lithographic process within a desired range. The speckle characteristic being a function of the radiation bandwidth.

20 Claims, 19 Drawing Sheets

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,587,704 | B2 | 9/2009 | Ye et al. |
| 10,416,566 | B2 | 9/2019 | Conley et al. |
| 2007/0186207 | A1 | 8/2007 | Sandstrom |
| 2009/0157360 | A1 | 6/2009 | Ye et al. |
| 2011/0304837 | A1 | 12/2011 | Patra |
| 2013/0179847 | A1 | 7/2013 | Hansen |
| 2019/0137889 | A1* | 5/2019 | Tel ......................... G03F 7/7065 |

OTHER PUBLICATIONS

K. Wakana et al., "Optical performance of laser light source for ArF immersion double patterning lithography tool," Proc SPIE, vol. 7274 (2009).

Office Action issued in corresponding Japanese Patent Application No. 2023-535287, dated Aug. 1, 2025.

* cited by examiner

600

OPTIMIZATION OF LITHOGRAPHIC PROCESS BASED ON BANDWIDTH AND SPECKLE

CROSS-REFERENCE TO RELATED APPLICATIONS

This application is the U.S. national phase entry of PCT Patent Application No. PCT/EP2021/084967 which was filed on Dec. 9, 2021, which claims the benefit of priority of U.S. Patent Application No. 63/129,957 which was filed on Dec. 23, 2020 and which is incorporated herein in its entirety by reference.

TECHNICAL FIELD

The description herein relates to lithographic apparatuses and processes, and including a method or apparatus to optimize an illumination source by allowing the bandwidth of the illumination source to change, for a given patterning device.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$, is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

Disclosed herein is a method for improving a lithographic process of imaging a portion of a design layout onto a substrate using a lithographic apparatus. The method includes computing a multi-variable cost function, the multi-variable cost function being a function of: (i) a plurality of design variables that affect characteristics of the lithographic process and (ii) a radiation bandwidth of a radiation source of the lithographic apparatus; and reconfiguring one or more of the characteristics of the lithographic process by adjusting one or more of the design variables until a termination condition is satisfied, the termination condition including a speckle characteristic being within a speckle specification associated with the radiation generation by the radiation source, while maintaining an image contrast associated with the lithographic process within a desired range, the speckle characteristic being a function of the radiation bandwidth. In an embodiment, the radiation bandwidth changes during the reconfiguration.

In an embodiment, the speckle characteristic is a metric associated with a speckle produced by mutual interference of a set of coherent wavefronts of the radiation source, the speckle indicative of local dose variations. In an embodiment, the speckle characteristic is a speckle contrast associated with the radiation generated by the radiation source, and wherein the speckle contrast is reduced or minimized during reconfiguration. In an embodiment, the speckle contrast associated with the radiation is characterized by contribution from both spatial coherence and temporal coherence, and reduction of the speckle contrast comprises reducing temporal coherence and/or spatial coherence. In an embodiment, the speckle contrast is computed by:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}},$$

where, $\lambda$ is the wavelength of the radiation, $A_{beam}$ is a source size, $\Omega_{divergence}$ is a source divergence, TIS is a pulse duration, and BW is the bandwidth.

In an embodiment, the characteristics associated with the lithographic process includes characteristics associated with one or more components of the lithographic apparatus or a process (e.g., resist process, etching process, etc.) related characteristic. For example, the characteristics includes one or more of: the image contrast of an image produced during the lithographic process; a process window of the lithographic process; a source characteristics; a performance indicator associated with the lithographic process; or the speckle characteristic and a range of bandwidth of the radiation source.

According to an embodiment, there is provided a non-transitory computer-readable medium for improving a lithographic process of imaging a portion of a design layout onto a substrate using a lithographic apparatus, the medium comprising instructions stored therein that, when executed by one or more processors, cause operations including steps of the method herein.

DETAILED DESCRIPTION

Figure 1:
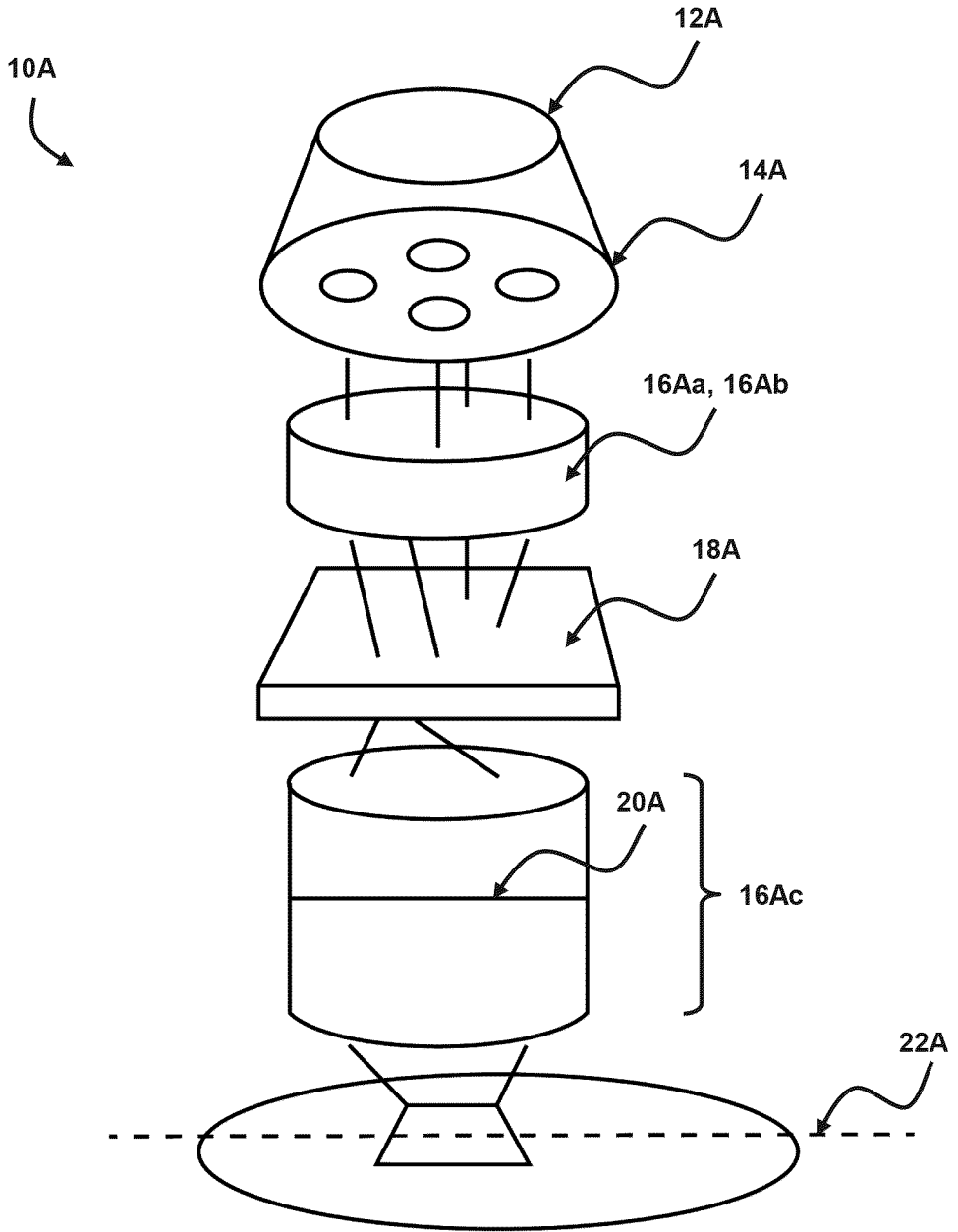
FIG. 1 is a block diagram of various subsystems of a lithography system, according to an embodiment, of the present disclosure.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "optimizing" and "optimization" as used herein refers to or means adjusting a lithographic projection apparatus, a lithographic process, etc. such that results and/or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Further, the lithographic projection apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin (Θmax), n is the Index of Refraction of the media between the last element of projection optics and the substrate, and Θmax is the largest angle of the beam exiting from the projection optics that can still impinge on the substrate plane 22A. The radiation from the radiation source 12A may not necessarily be at a single wavelength. Instead, the radiation may be at a range of different wavelengths. The range of different wavelengths may be characterized by a quantity called "imaging bandwidth," "source bandwidth" or simply "bandwidth," which are used interchangeably herein. A small bandwidth may reduce the chromatic aberration and associated focus errors of the downstream components, including the optics (e.g., optics 14A, 16Aa and 16Ab) in the source, the patterning device and the projection optics. However, that does not necessarily lead to a rule that the bandwidth should never be enlarged.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In the case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation) to a patterning device and projection optics direct and shape the illumination, via the patterning device, onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
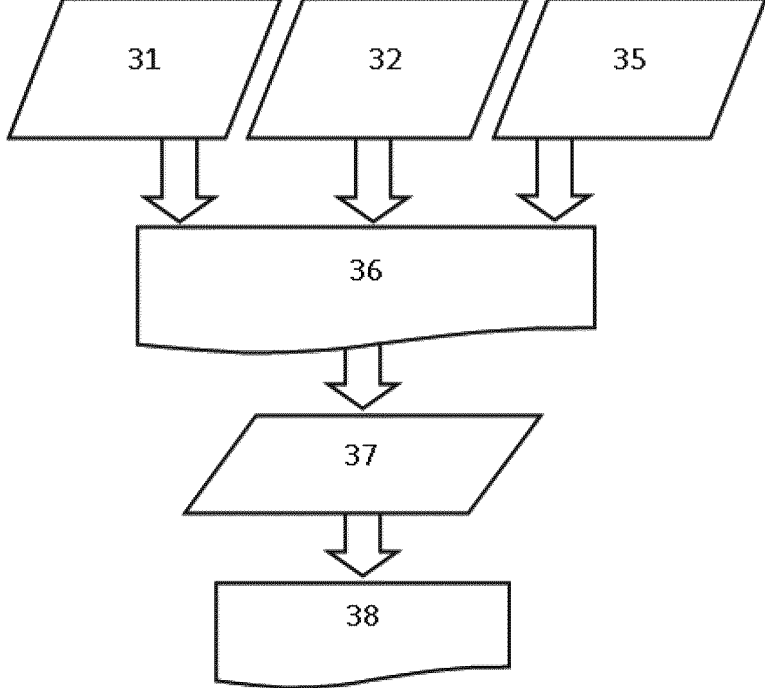
FIG. 2 is a block diagram of simulation models corresponding to the subsystems in FIG. 1, according to an embodiment, of the present disclosure.

An exemplary flow chart for simulating lithography in a lithographic projection apparatus is illustrated in FIG. 2. A source model 31 represents optical characteristics (including radiation intensity distribution, bandwidth and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the source model 31, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). The projection optics model 32 can represent the optical characteristics of the projection optics, including aberration, distortion, one or more refractive indexes, one or more physical sizes, one or more physical dimensions, etc. The design layout model can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

As explained above, the bandwidth of the source does not have to be kept as small as the hardware of the source is able. The bandwidth may be used as an additional design variable, which can lead to additional flexibility or improvement of the lithographic process. The optical characteristics represented by the source model 31 may include the bandwidth. Examples of the effects of widening the bandwidth will be discussed in relation with FIG. 5.

Figure 3A:
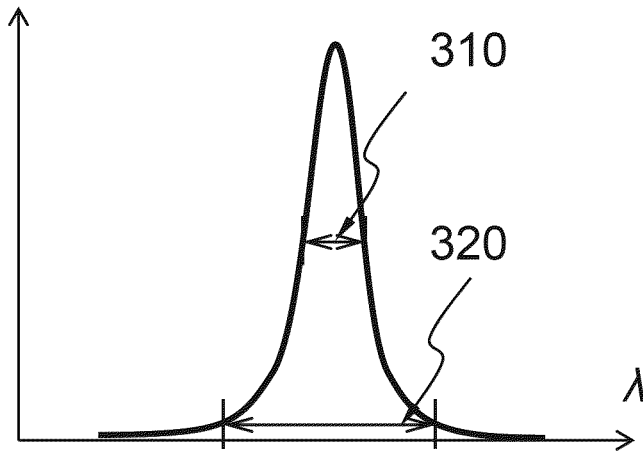
FIG. 3A shows two definitions of the bandwidth, according to an embodiment, of the present disclosure.
Figure 3B:
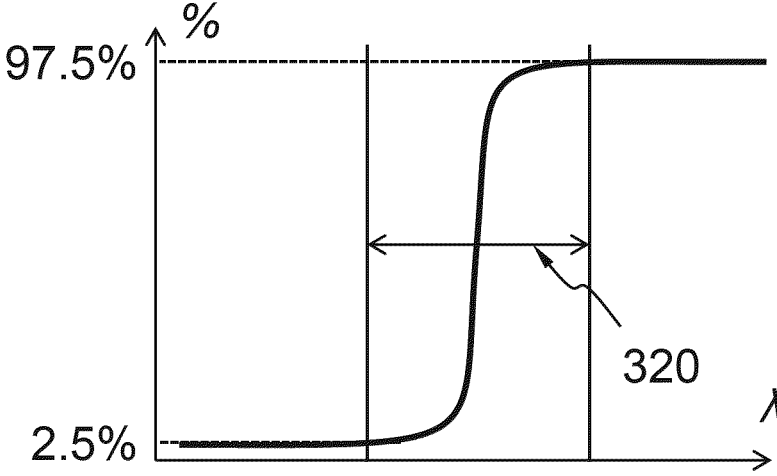
FIG. 3B shows a curve of Normalized Integrated Energy (vertical axis) as a function of the wavelength (horizontal axis), according to an embodiment of the present disclosure.

FIG. 3A schematically shows two definitions of the bandwidth. Other definitions are possible. The first is the full width at half maximum (FWHM) bandwidth 310. As its name suggests, the FWHM bandwidth is the width of the emission peak of the source radiation (from a radiation source) at half of the height of the emission peak. This FWHM bandwidth 310 conveys a general representation of the source radiation spectrum and its changes at the half intensity, but it does not characterize the spectral shape. The second is the E95 bandwidth 320. The E95 bandwidth is the spectral width that contains 95% of the integrated energy of the source radiation. The E95 bandwidth provides more information about the spectral shape and is very sensitive to small changes in spectral background intensity. FIG. 3B shows a curve of Normalized Integrated Energy (vertical axis) as a function of the wavelength (horizontal axis). The E95 bandwidth is the spectral width from 2.5% integrated energy of the source radiation to 97.5%.

The bandwidth may be adjusted as another design variable, for a variety of purposes. For example, the bandwidth may be adjusted to improve the image quality e.g., contrast (characterized by one or more metrics such as image log-slope (ILS) and/or normalized image log-slope (NILS) where higher ILS or NILS indicates a sharper image), to increase latitude for another design variable (e.g., depth of focus, exposure latitude), increase the size of the process window, and/or improve critical dimension uniformity (CDU) across the substrate or local CDU on the substrate. In an embodiment, ILS or NILS is a function of image intensities at given positions within an image. For example, the slope of the image intensity may be computed as of function of position (dI/dx) that measures the steepness of the image in the transition from bright to dark, and the slope can be further divided by the intensity I to compute the image log-slope. In an embodiment, the image log-slope may be multiplied by a geometric characteristic of a feature (e.g., nominal linewidth) to compute NILS of the image. The bandwidth may be increased to a value greater than the minimum that hardware of the source allows.

In situations where a design variable has a constraint, allowing the bandwidth to be adjusted gives more flexibility and may improve the lithographic process despite the constraint. For example, after a patterning device has been made, its design layout probably cannot be adjusted. Namely, the design variables have a constraint that any geometrical characteristics of the patterning device are not allowed to change in the optimization. The term "geometrical characteristics of the patterning device" as used herein means characteristics of the shape and/or sizes of the design layout of the patterning device. Even if the illumination has been optimized (e.g., optimized alone, or co-optimized with the patterning device and/or the projection optics) before the patterning device was made without allowing the bandwidth to be adjusted, re-optimizing the illumination, the projection optics, non-geometrical characteristics of the patterning device, or a combination thereof, in combination with allowing the bandwidth to change, after the patterning device has been made, may improve the lithographic process despite that the patterning device cannot be adjusted any more.

Figure 4:
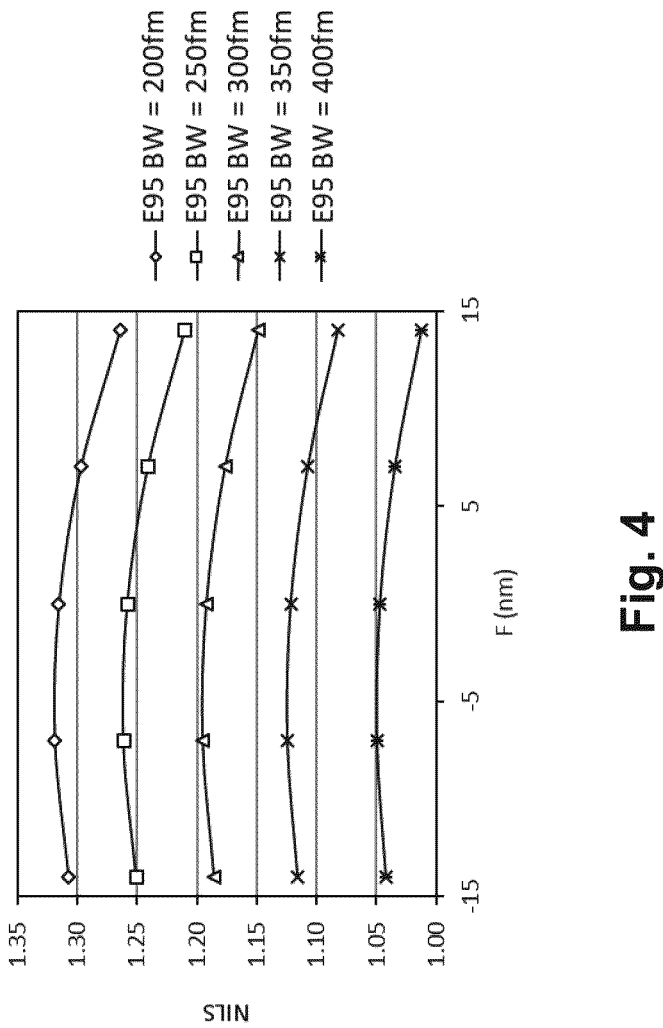
FIG. 4 shows an example of the effect of changing the bandwidth, according to an embodiment of the present disclosure.

FIG. 4 shows an example of the effect of changing the bandwidth. In this example, the E95 bandwidth is changed from 200 fm to 400 fm in 50 nm increments, where the NILS decreases as a result. In this example, the dose is unchanged. The horizontal axis of FIG. 4 shows the focus.

Figure 5:
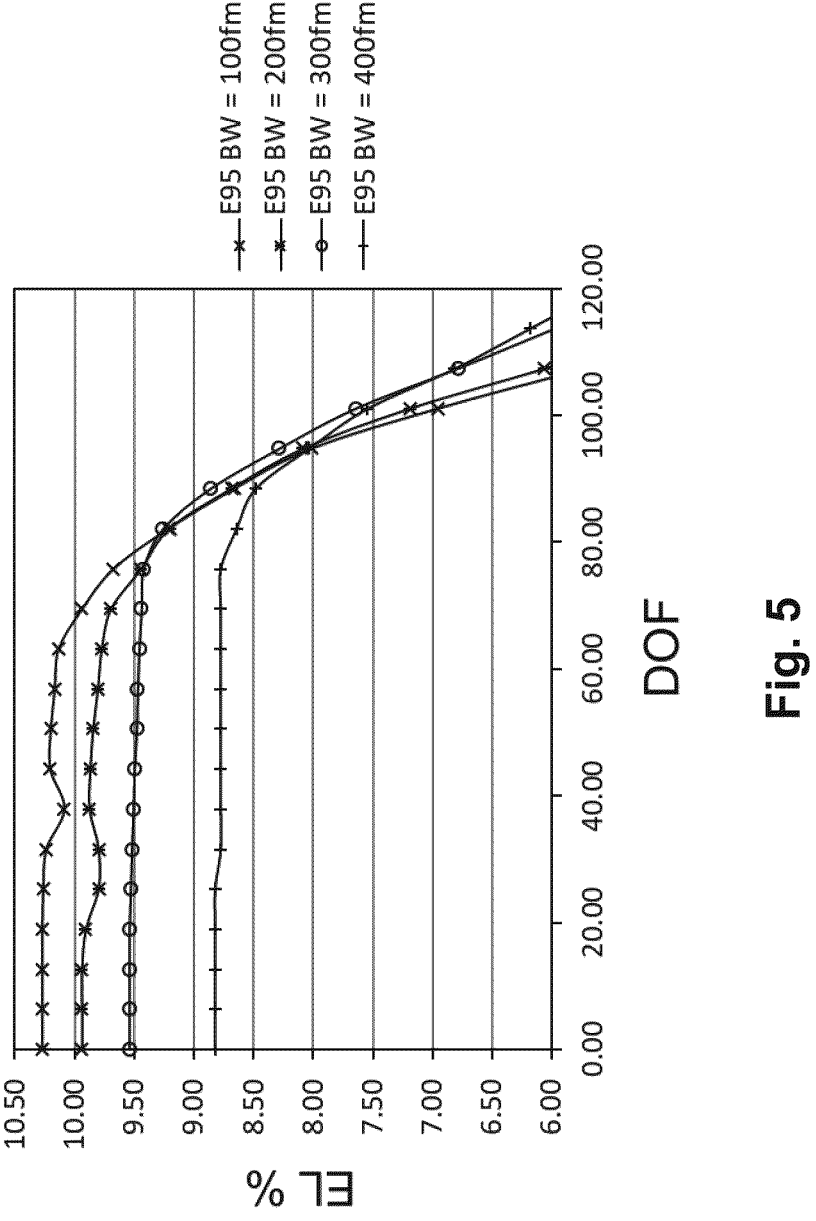
FIG. 5 shows another example of the effect of changing the bandwidth, according to an embodiment of the present disclosure.

FIG. 5 shows another example of the effect of changing the bandwidth. In this example, the E95 bandwidth is changed from 100 fm to 400 fm in 100 fm increments; the exposure latitude (EL %) decreases and the depth of focus (DOF) increases as a result. This may be useful where there is not a requirement for improved exposure latitude but a requirement of a higher depth of focus. Widening the bandwidth allows higher depth of focus at the expense of the exposure latitude. This flexibility may not be available if the bandwidth is always fixed at the minimal value the hardware can achieve.

Further, polarization has an effect. For example, for an array of features elongate in a same direction, best results may be achieved with a low bandwidth (e.g., 200 fm compared to 300 fm or higher) and TE polarization compared to low bandwidth (e.g., 200 fm) and XY polarization.

Further, the bandwidth limits need not be symmetric about a nominal wavelength. For example, one end of the boundary of the bandwidth may be further from the nominal wavelength than the other end of the boundary. Thus, the symmetry of the bandwidth limits (e.g., whether one end of the bandwidth limit is further from the nominal wavelength than the other end of the bandwidth limit) may be evaluated, i.e., varied, in the optimization.

Further, the distribution of the bandwidth may vary from, e.g., a Gaussian distribution. Thus, the distribution of the bandwidth around the nominal wavelength (e.g., changing to a non-Gaussian distribution) may be evaluated, i.e., varied, in the optimization.

The bandwidth size, limits, distribution, etc. can be tuned, e.g., in the radiation source (e.g., laser) by appropriate tuning apparatus. For example, a line narrowing module (having, e.g., moving prisms) and/or a dithering apparatus can change the bandwidth size, limits, distribution, etc.

As chip manufacturing continues extending use of laser sources in lithography to the 7 nm node and below, variables that were previously inconsequential to the successful patterning of wafers have become more impactful, requiring solutions to minimize their negative effects. For example, excimer-laser light sources used to illuminate mask patterns and project the mask features onto photoresist-coated wafers are now showing the potential impact of a self-interference phenomenon called speckle. Speckle leads to local illumination non-uniformity, which can in turn result in a non-uniform exposure of photoresist and result in poorer pattern fidelity.

Speckle appears when coherent light interfere with each other when projected at a spot on a surface. Within the spot, radiation intensity varies randomly from darkest, if contributions of the scattering points inside the spot interfere destructively, to brightest if they interfere constructively. These intensity fluctuations within the spot is referred to as speckle. In an embodiment, speckle results in local dose variations during the lithographic process. To solve the problem of speckle, many attempts have been made, mostly based on angle diversification, obtained by means of diffusers and/or movable optical elements, or by means of polarization diversification.

In some applications, speckle can impact critical dimension uniformity (CDU), for example, mostly localized CDU (LCDU) (e.g., corresponding to a portion of design layout, or a field of view of an inspection tool). According to one embodiment, speckle may be reduced by increasing the radiation bandwidth or the radiation pulse length. In an embodiment, the radiation bandwidth may be increased along with reconfiguration of source and/or mask (e.g., via SO or SMO process) for a given pattern to obtain high image quality with decreased local CDU (LCDU) due to speckle. In an embodiment, a reduction of CDU and local CDU due to speckle while maintain imaging contrast (e.g., image contrast at a standard 300 fm bandwidth) from increased laser bandwidth (which decreases speckle contrast) can be achieved.

The speckle reduction according to the present disclosure have several advantages. For example, increasing pulse length decreases speckle, which in turn decreases linewidth roughness (LWR) of a structure. Increasing a number of independent speckle patterns to reduce speckle can be done by pulse stretching and/or increasing source bandwidth to assist in the further reduction of local CD variation. Increasing laser bandwidth decreases speckle. Furthermore, optimization of imaging pupil and mask OPC (SMO-OPC) and source only (SO) optimization can performed to further determine an optimal bandwidth setting to compensate for loss of image contrast due to increased bandwidth (e.g., bandwidth more than the standard 300 fm bandwidth).

Figure 6:
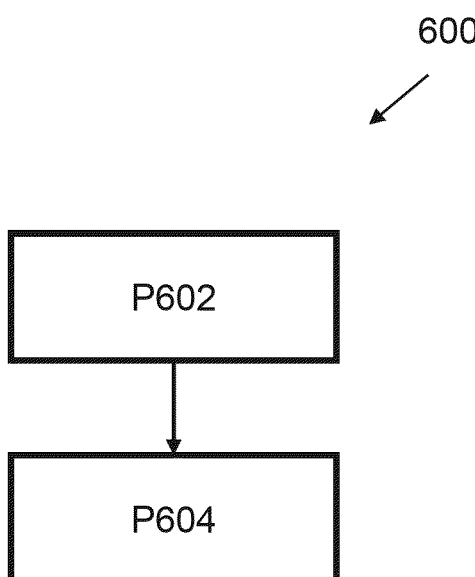
FIG. 6 is a flow diagram of a method for improving a lithographic process, according to an embodiment of the present disclosure.

FIG. 6 is a flow chart of a method 600 for improving a lithographic process of imaging a portion of a design layout onto a substrate using a lithographic apparatus. In an embodiment, an improving of the lithographic process may be achieved by increasing the bandwidth and/or pulse duration, reducing the speckle and maintaining an image quality. For example, the bandwidth may be more than the standard 300 fm bandwidth, and/or the pulse length extension (e.g., up to 430 ns) which is substantially greater than a standard pulse duration (e.g., 150 ns). In an embodiment, the portion of the design layout comprises one or more selected from the following: an entire design layout, a clip, a section of a design layout that is known to have a critical feature, a section of the design layout where a hot spot or a warm spot has been identified, or a section of the design layout where a critical feature has been identified. In an embodiment, the method 600 includes processes P602 and P604 further discussed in detail below.

Process P602 includes computing a multi-variable cost function, which is the multi-variable cost function CF is a function of: (i) a plurality of design variables (e.g., $z_1$, $z_2$, . . ., $z_N$) that affect characteristics of the lithographic process and (ii) a radiation bandwidth (BW) of a radiation source of the lithographic apparatus. In an embodiment, the cost function CF may be represented as equation 1 or other cost function equations discussed herein. Examples of the cost function computation are described throughout the present disclosure. In an embodiment, the cost function is one or more selected from the following: edge placement error (EPE), pattern placement error (PPE), critical dimension (CD), a local CD uniformity as a function of the speckle characteristic, resist contour distance, worst defect size, best focus shift, or mask rule check. In an embodiment, the cost function is a function of EPE, CD, LCDU, speckle characteristic, resist contour distance, worst defect size, best focus shift, mask rule check, or other characteristics related to lithographic process.

In an embodiment, the radiation bandwidth may be expressed as a design variable. In an embodiment, the radiation bandwidth is characterized by a range of radiation bandwidth; a function of a variable that is a function of the bandwidth; or a function of a variable that affects the bandwidth, the variable being a function of one or more of a plurality of design variables that represent one or more characteristics of the lithographic process. In an embodiment, the radiation bandwidth is a full width at half maximum (FWHM) bandwidth, as discussed with respect to FIGS. 3A and 3B. In an embodiment, the radiation bandwidth is an E95 bandwidth, as discussed with respect to FIGS. 4 and 5. In an embodiment, the bandwidth may be greater than the standard bandwidth 300 fm. For example, the bandwidth may be in a range 400 fm to 1000 fm. In an embodiment, the radiation bandwidth is increased to a value greater than a minimum that hardware of the source allows.

In an embodiment, the radiation source is a component that generates the radiation used in the lithographic process. In an embodiment, the radiation source is a radiation source model configured to mimic the radiation used in the lithographic process.

In an embodiment, the design variables comprises one or more variables associated with: an illumination (e.g., intensity, pupil shape, etc.) of the lithographic apparatus; geometric properties (e.g., shape, size, etc.) of the design layout; projection optics of the lithographic apparatus; a resist (e.g., resist thickness, type of resist, etc.) of the substrate; or an aerial image or a resist image associated with the lithographic process. In an embodiment, the aerial image or the resist image is a simulated image. Additional examples of the design variables are described throughout the specification. For example, design variables that may be adjusted during different processes such as SO and SMO are discussed with respect to FIGS. 10-13.

Figure 7:
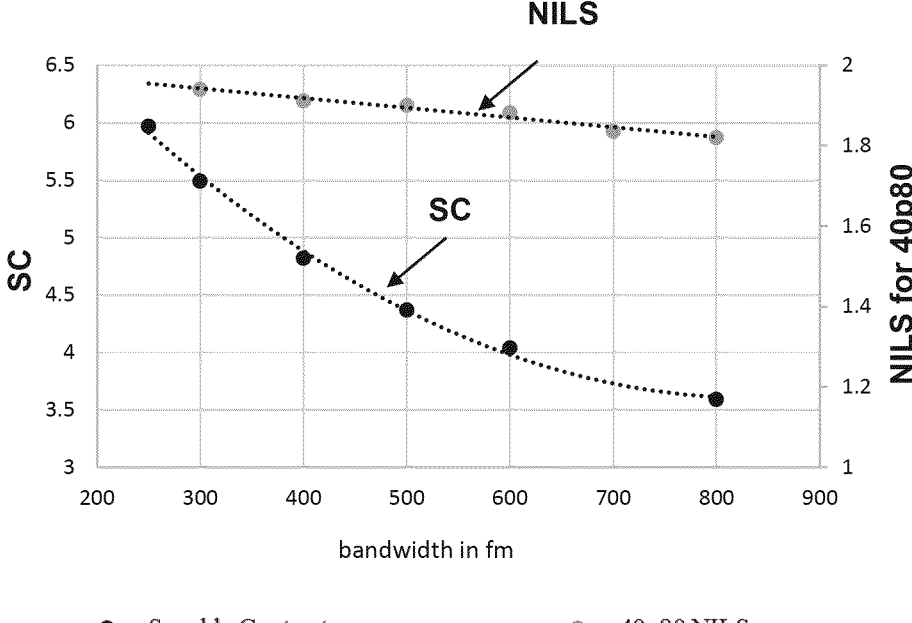
FIG. 7 illustrates behavior of a speckle contrast and an image contrast as a function of bandwidth, according to an embodiment of the present disclosure.

Process P604 includes reconfiguring one or more of the characteristics of the lithographic process by adjusting one or more of the design variables until a termination condition is satisfied. In an embodiment, the termination condition includes a speckle characteristic being within a speckle specification associated with the radiation generation by the radiation source, while maintaining an image quality associated with the lithographic process within a desired range. The speckle characteristic is a function of the radiation bandwidth. In an embodiment, the radiation bandwidth may be changed during the reconfiguration. In an embodiment, the image quality may be characterized by an image contrast or a normalized image log-slope (NILS) metric (normalized to the feature size) of an image generated during the lithographic process. In an embodiment, the termination condition may further include maintaining an edge placement error (EPE) associated with a pattern on a substrate within a desired EPE range. FIG. 7 illustrates example reduction in speckle contrast while maintaining the NILS within a desired range of the best NILS (e.g., less than 3% of best NILS).

In an embodiment, the termination condition includes, but not limited to, one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process.

In an embodiment, the cost function may be minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

In an embodiment, the termination includes the speckle characteristic, which may be a metric associated with a speckle produced by mutual interference of a set of coherent wavefronts of the radiation source. In an embodiment, the speckle is indicative of local dose variations.

In an embodiment, the speckle characteristic may be a speckle contrast associated with the radiation generated by the radiation source, and wherein the speckle contrast is reduced or minimized during reconfiguration. In an embodiment, the speckle contrast associated with the radiation is characterized by contribution from both spatial coherence and temporal coherence, and reduction of the speckle contrast comprises reducing temporal coherence, spatial coherence, or both.

In an embodiment, the speckle contrast is computed by following:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}}$$

In the above equation, $\lambda$ is the source wavelength, $A_{beam}$ is a source size, $\Omega_{divergence}$ is a source divergence, TIS is a time-integral square (TIS) pulse length of the radiation source, c is light source, and BW is the radiation bandwidth. In an embodiment, the radiation bandwidth is increased to a value greater than a minimum that hardware of the source allows.

Decreasing the speckle contrast is possible by increasing the etendue, which is the product of the beam size $A_{beam}$ and the source divergence $\Omega_{divergence}$. However, increasing the etendue requires a significant redesign of main components of source, which is a quite-complex effort. On the other hand, it is possible to increase the spectral laser bandwidth (BW), but this will negatively impact the image contrast. According to present disclosure, the time-integral square (TIS) pulse length may be increased to achieve speckle contrast reduction.

Based on the above equation, computing the speckle contrast assuming 4% spatial speckle contrast, and using a standard bandwidth of 300 fm and E95 at 130 ns pulse duration, the speckle contrast is approximately 5.75. On the other hand, using an increased bandwidth of 600 fm and E95 delivered at a pulse length extension of 430 ns, the speckle contrast is 3.6, which is approximately 30% reduction in speckle contrast compared to standard bandwidth.

In another example, computing the speckle contrast assuming 3% spatial speckle contrast, and using a standard bandwidth of 300 fm and E95 at 130 ns pulse duration, the speckle contrast is approximately 5.25. On the other hand, using a BW 600 fm and E95 delivered at a pulse length extension of 430 ns, the speckle contrast is 3.6, which is approximately 35% reduction in speckle contrast.

Based on experimental results, comparing a baseline pulse stretcher (e.g., limited to 130 ns) and a pulse stretcher configured to extend the pulse duration up to approximately 450 ns, results show that the pulse stretcher delivering approximately 450 ns pulse length achieves a greater than 30% reduction in LWR (LCDU).

In an embodiment, the characteristics of the lithographic process includes, but not limited to, one or more of: the image contrast of an image produced during the lithographic process; a process window of the lithographic process; a performance indicator associated with the lithographic process; and/or a source characteristics such as the speckle characteristic and a range of bandwidth of the radiation source.

In an embodiment, reconfiguring the one or more of the characteristics of the lithographic process includes performing source optimization or source mask optimization. For example, reconfiguring includes performing, via one or more process models associated with the lithographic process, a source optimization using the multi-variate cost function such that the speckle contrast is reduced (e.g., compared to using standard bandwidth) while maintaining an image contrast within a desired range. In another example, reconfiguring includes performing, via one or more process models associated with the lithographic process, a source mask co-optimization using the multi-variate cost function such that the speckle contrast is reduced (e.g., compared to using standard bandwidth) while maintaining an image contrast within a desired range. FIGS. 10-13 provides example flow charts of SO and SMO which can be modified using cost-function (e.g., including bandwidth) and termination conditions (e.g., speckle contrast and image contrast) discussed herein.

In an embodiment, reconfiguring the one or more of the characteristics of the lithographic process maintains the image contrast associated the design layout or a portion of the design layout within a desirable range (e.g., 3%, 5%, or 10%) of best image contrast. For example, FIG. 7 illustrates substantial reduction (e.g., greater than 30%) of the speckle contrast while maintaining a loss in the image contrast within 3% of the best image contrast. In an embodiment, reconfiguring the one or more of the characteristics of the lithographic process increases latitude of at least one of the design variables. In an embodiment, the latitude is depth of focus or exposure latitude. In an embodiment, reconfiguring the one or more of the characteristics of the lithographic process increases a size of a process window. In an embodiment, reconfiguring the one or more of the characteristics of the lithographic process optimizes the radiation bandwidth of the radiation source until the termination condition is satisfied.

In an embodiment, reconfiguring the one or more of the characteristics of the lithographic process is an iterative process. Each iteration includes (i) simulating, by perturbing the one or more design variables, one or more process models associated with the lithographic process; (ii) computing the multi-variate cost function using values of the design variables and simulation results; (iii) determining based on the multi-variate cost function whether the termination condition is satisfied; and (iv) responsive to the termination condition not being satisfied, further perturbing the one or more design variables and performing steps (i)-(iv).

In an embodiment, an optimal radiation bandwidth may be determined to improve the lithographic process. For example, a method for determining optimal radiation bandwidth may include computing a multi-variable cost function, the multi-variable cost function being a function of: (i) a plurality of design variables that affect characteristics of the lithographic process and (ii) a radiation bandwidth of a radiation source of the lithographic apparatus. For example, computing the multi-variate cost function may be same as process P602 discussed with respect to FIG. 6. Further the method includes determining an optimal radiation bandwidth by adjusting one or more design variables until a termination condition is satisfied. The termination condition including a speckle characteristic being within a speckle specification associated with the radiation generation by the radiation source, while maintaining an image contrast associated with the lithographic process within a desired range. The speckle characteristic being a function of the radiation bandwidth, as discussed above.

As discussed herein, the speckle characteristic is a metric associated with a speckle produced by mutual interference of a set of coherent wavefronts of the radiation source, the speckle indicative of local dose variations. The speckle characteristic is a speckle contrast associated with the radiation generated by the radiation source, and wherein the speckle contrast is caused to reduce or minimize during determination of the optimal bandwidth. The speckle contrast is computed using the Speckle Contrast equation discussed above.

Also, as discussed herein, the cost function may be one or more selected from the following: edge placement error, pattern placement error, critical dimension (CD), a local CD uniformity as a function of the speckle characteristic, resist contour distance, worst defect size, best focus shift, or mask rule check. In an embodiment, the termination condition may include one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process. As discussed herein, the design variables comprises one or more variables associated with: an illumination of the lithographic apparatus; geometric properties of the design layout; projection optics of the lithographic apparatus; a resist of the substrate; or an aerial image or a resist image generated during the lithographic process.

FIG. 7 illustrates exemplary relationship between speckle contrast and NILS as a function of bandwidth for features size of 40 nm and 80 nm pitch. The data is generated by reconfiguring via SMO-OPC simulation suing 40 nm linespace feature combination for each bandwidth change. The graph on the left, on the Y1 axis is the speckle contrast vs bandwidth (X-axis), and the graph on the right, on the Y2 axis is NILS vs bandwidth (X-axis). The results demonstrate that the speckle contrast is reduced substantially, while NILS is maintained or has a loss of less than 3% loss of best NILS. Furthermore, additional lithography related optimization (e.g., illumination, resist, etc.) may be performed to improve the lost in NILS value.

Figure 8A:
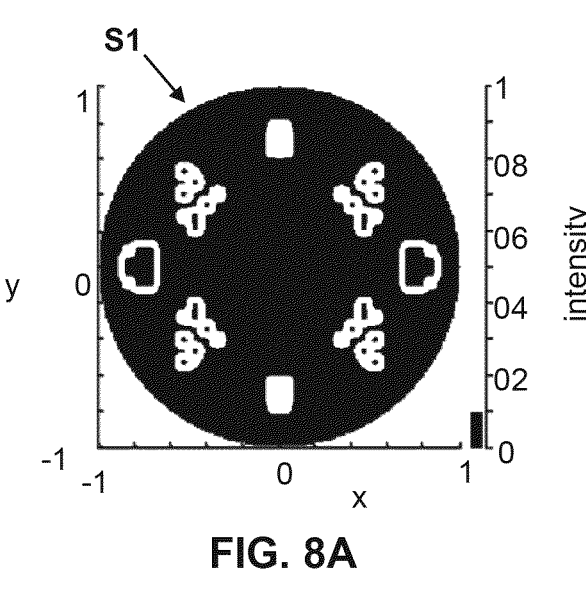
FIGS. 8A, 8B, and 8C illustrate sources reconfigured for different bandwidths such as 300 fm, 500 fm, and 1000 fm, respectively, according to an embodiment of the present disclosure.
Figure 8B:
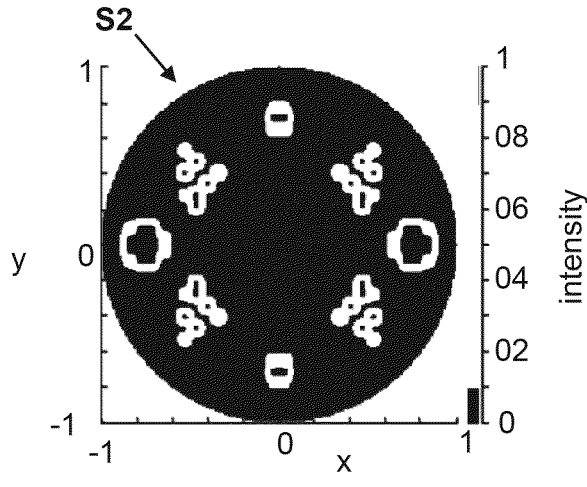
Figure 8C:
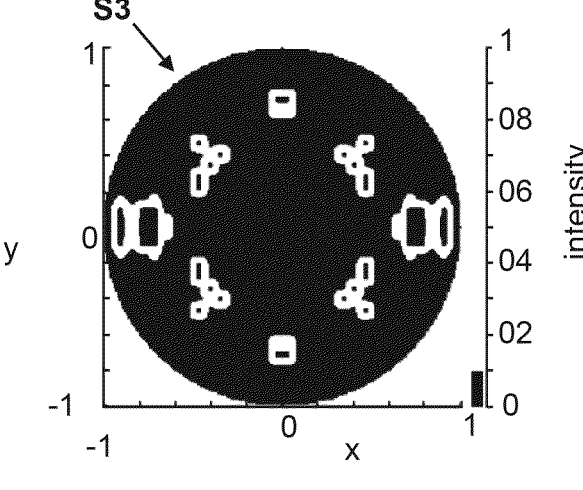

FIGS. 8A, 8B, and 8C illustrate results of source only optimization for different bandwidths, according to an embodiment. In an embodiment, the source is reconfigured for increasing bandwidth while maintain a fixed mask and NILS. For example, a source pupil S1 correspond to the bandwidth of 300 fm, a source pupil S2 correspond to the bandwidth of 500 fm, and a source pupil S3 correspond to the bandwidth of 1000 fm. Comparing source pupils S1, S2, and S3 illustrates different pupil characteristics such as shapes characterized by different intensities (e.g., represented by real number ranging from 0 (darkest/black) to 1 (brightest/white)) at different portions of the pupil. For example, bright portions of the pupil S1 are different from bright portions of the pupil S2, and S3, respectively. Such change in the pupil, for respective bandwidth, causes the characteristics of the lithographic process to be within desired range. In an embodiment, this option of a source only optimization without changing the mask layout may be desirable as changing mask layout may not expensive or complex affair (e.g., during lithographic manufacturing).

Figures 9A, 9B, 9C:
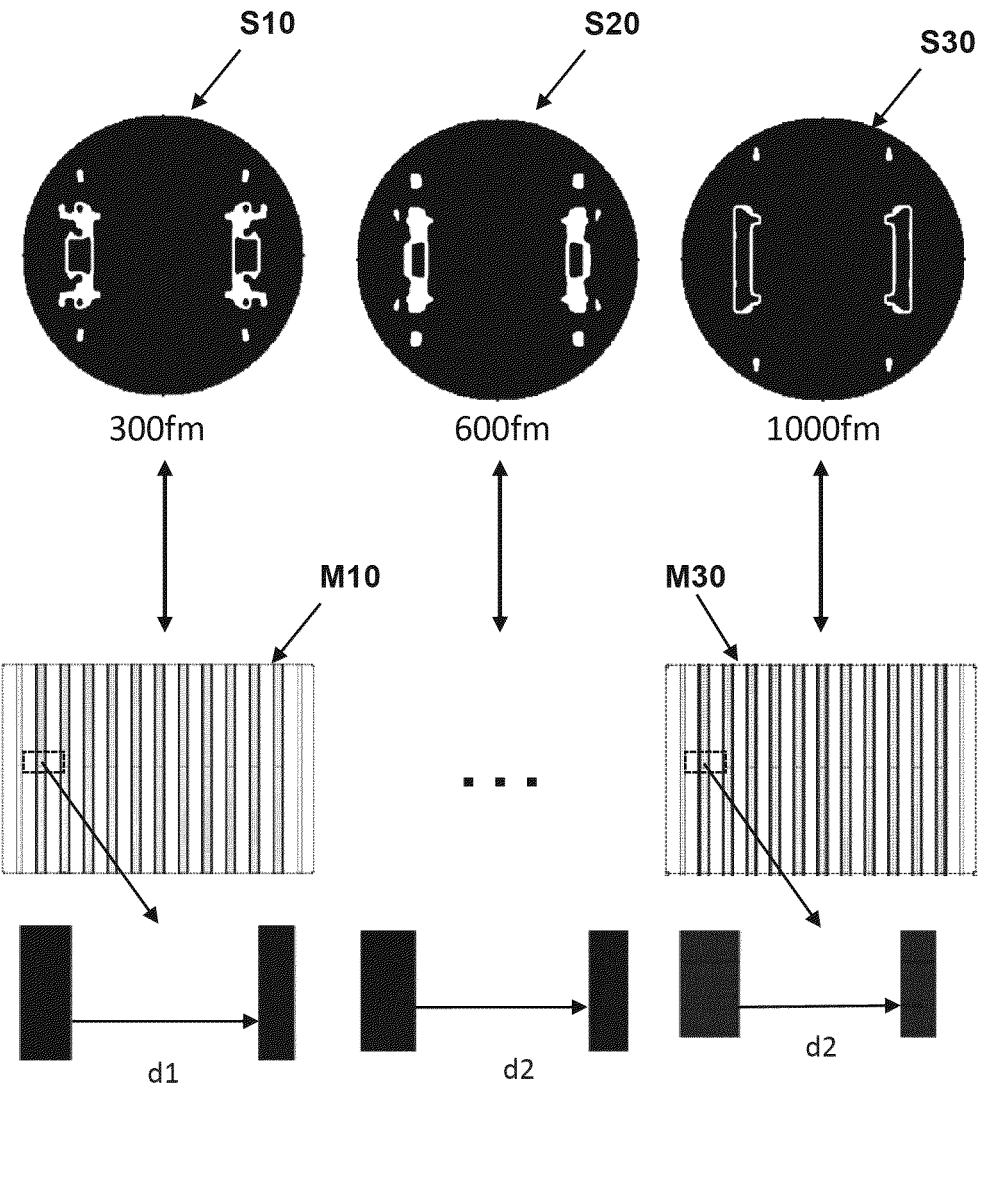
FIGS. 9A, 9B, and 9C illustrate source and mask co-optimized for different bandwidths such as 300 fm, 600 fm, and 1000 fm, respectively, according to an embodiment of the present disclosure.

FIGS. 9A, 9B, and 9C illustrate results of source-mask co-optimization for different bandwidths, according to an embodiment. In an embodiment, the source is reconfigured for increasing bandwidth while modifying a mask layout (e.g., distance between main features) to maintain NILS within desired range. In FIG. 9A, a source pupil S10 and a mask layout M10 having a features with distance d1 correspond to the bandwidth of 300 fm. In FIG. 9B, a source pupil S20 and a mask layout M20 having features with distance d2 correspond to the bandwidth of 600 fm. In FIG. 9C, a source pupil S30 and a mask layout M30 correspond to the bandwidth of 1000 fm. In an embodiment, the distances between features in mask layouts M10, M20 and M30 may be different. For example, the distance d1>d2>d3. Comparing source pupils S10, S20, and S30, the sources have differences at brighter portions, such change in pupil in combination with corresponding mask layout M10, M20, and M30, respectively, causes the characteristics of the lithographic process to be within desired range.

According to present disclosure, the combination and sub-combinations of disclosed elements constitute separate embodiments. For example, a first combination includes improving a lithographic process of imaging a portion of a design layout onto a substrate using a lithographic apparatus by modifying design variables to cause a speckle characteristic within a speckle specification, while maintaining an image contrast associated with the lithographic process within a desired range. In a sub-combination the improving of the lithographic process may also satisfy EPE associated with the lithographic process. A second combination includes reconfiguring a source, a mask or both a source and mask to satisfy one or more characteristics (e.g., EPE) of the lithographic process. A third combination includes determining optimized bandwidth by minimizing speckle and maintaining an image contrast within a desired range (e.g., 3%, 5% or 10%) of the best image contrast.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \qquad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $CF(z_1, z_2, \ldots, z_N)$ can be a function of the bandwidth, a function of a variable that is a function of the bandwidth or that affects the bandwidth, wherein the bandwidth or the variable is in turn a function (e.g., an identity function) of the design variables $(z_1, z_2, \ldots, z_N)$. $CF(z_1, z_2, \ldots, z_N)$ may be an explicit function of the bandwidth. $CF(z_1, z_2, \ldots, z_N)$ may be an explicit function of a variable that is a function of the bandwidth or that affects the bandwidth. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, or a combination thereof. In one embodiment, the design variables $(z_1, z_2, \ldots, z_N)$ comprise one or more selected from dose, global bias of the patterning device, and/or shape of illumination. In one embodiment, the design variables $(z_1, z_2, \ldots, z_N)$ comprise the bandwidth of the source. Since it is the resist image that often dictates the pattern on a substrate, the cost function may include a function that represents one or more characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can include any adjustable parameter such as an adjustable parameter of the source (e.g., the bandwidth), the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the evaluation points and the cost function. Such changes can be simulated from a model or actually measured.

The design variables may have constraints, which can be expressed as $(z_1, z_2, \ldots, z_N) \in Z$, where Z is a set of possible values of the design variables. In an embodiment, the design variable may be bandwidth and the constraint may be a speckle characteristic. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput. In an embodiment, the constraints on the design variables are such that the design variables cannot have values that change any geometrical characteristics of the patterning device—namely, the patterns on the patterning device will remain unchanged during the optimization.

The optimization process therefore is to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg \min_{(z_1, z_2, \ldots, z_N) \in Z} CF(z_1, z_2, \ldots, z_N) \qquad \text{(Eq. 2)}$$

Figure 10:
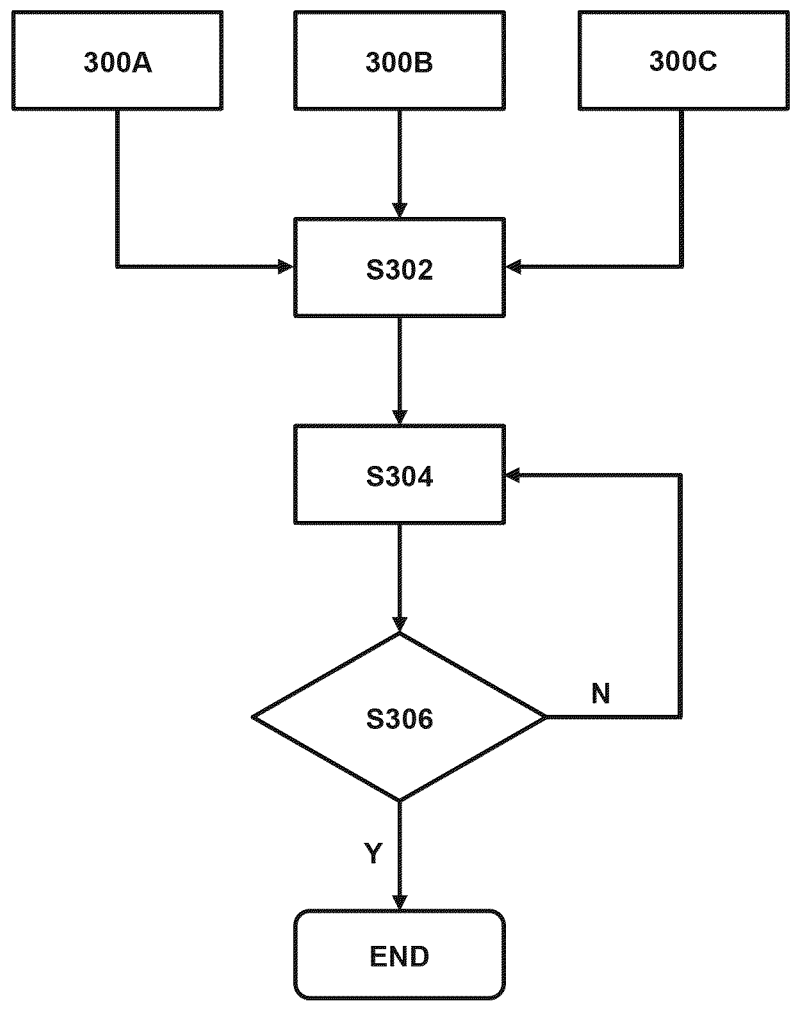
FIG. 10 is a flow diagram illustrating aspects of an example methodology of joint optimization/co-optimization, according to an embodiment of the present disclosure.

A general method of optimizing, according to an embodiment, is illustrated in FIG. 10. This method comprises a step S302 of defining a multi-variable cost function of a plurality of design variables. The design variables may comprise any suitable combination selected from design variables representing one or more characteristics of the illumination (300A) (e.g., pupil fill ratio, namely percentage of radiation of the illumination that passes through a pupil or aperture), one or more characteristics of the projection optics (300B) and/or one or more characteristics of the design layout (300C). For example, the design variables may include design variables representing one or more characteristics of the illumination (300A) (e.g., being or including the bandwidth) and of the design layout (300C) (e.g., global bias) but not of one or more characteristics of the projection optics (300B), which leads to an illumination-patterning device (e.g., mask) optimization ("source-mask optimization" or SMO). Or, the design variables may include design variables representing one or more characteristics of the illumination (300A) (optionally polarization), of the projection optics (300B) and of the design layout (300C), which leads to an illumination-patterning device (e.g., mask)-projection system (e.g., lens) optimization ("source-mask-lens optimization" or SMLO). Or, the design variables may include design variables representing one or more characteristics of the illumination (300A) (e.g., being or including the bandwidth), one or more non-geometrical characteristics of the patterning device, or one or more characteristics of the projection optics (300B), but not any geometrical characteristics of the patterning device. In step S304, the design variables are simultaneously adjusted so that the cost function is moved towards convergence. In an embodiment, not all design variables may be simultaneously adjusted. Each design variable may also be adjusted individually. In step S306, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step S306 is satisfied, the method ends. If the one or more conditions in step S306 is not satisfied, the steps S304 and S306 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets.

Different subsets of the design variables (e.g., one subset including characteristics of the illumination, one subset including characteristics of patterning device and one subset including characteristics of projection optics) can be optimized alternatively (referred to as Alternative Optimization) or optimized simultaneously (referred to as Simultaneous Optimization). So, two subsets of design variables being optimized "simultaneously" or "jointly" means that the design variables of the two subsets are allowed to change at the same time. Two subsets of design variables being optimized "alternatively" as used herein means that the design variables of the first subset but not the second subset are allowed to change in the first optimization and then the design variables of the second subset but not the first subset are allowed to change in the second optimization.

Figure 11:
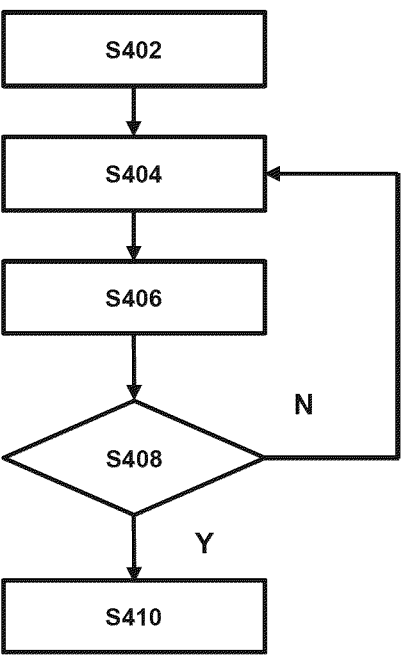
FIG. 11 shows an embodiment of a further optimization method, according to an embodiment of the present disclosure.

In FIG. 10, the optimization of all the design variables is executed simultaneously. Such a flow may be called simultaneous flow or co-optimization flow. Alternatively, the optimization of all the design variables is executed alternatively, as illustrated in FIG. 11. In this flow, in each step, some design variables are fixed while other design variables are optimized to optimize the cost function; then in the next step, a different set of variables are fixed while the others are optimized to minimize or maximize the cost function. These steps are executed alternatively until convergence or a certain terminating condition is met. As shown in the non-limiting example flowchart of FIG. 11, first, a design layout (step S402) is obtained, then a step of illumination optimization is executed in step S404, where the one or more design variables (e.g., the bandwidth) of the illumination are optimized (SO) to minimize or maximize the cost function while other design variables are fixed. Then in the next step S406, a projection optics optimization (LO) is performed, where the design variables of the projection optics are optimized to minimize or maximize the cost function while other design variables are fixed. These two steps are executed alternatively, until a certain terminating condition is met in step S408. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-LO-Alternative-Optimization is used as an example for the alternative flow. As another example, a first illumination-patterning device co-optimization (SMO) or illumination-patterning device-projection optics co-optimization (SMLO) can be performed without allowing the bandwidth to change, followed by a second SO or illumination-projection optics co-optimization (SLO) allowing the bandwidth to change. Finally the output of the optimization result is obtained in step S410, and the process stops.

The pattern selection algorithm, as discussed before, may be integrated with the simultaneous or alternative optimization. For example, when an alternative optimization is adopted, first a full-chip SO can be performed, one or more 'hot spots' and/or 'warm spots' are identified, then a LO is performed. In view of the present disclosure numerous permutations and combinations of sub-optimizations are possible in order to achieve the desired optimization results.

Figure 12A:
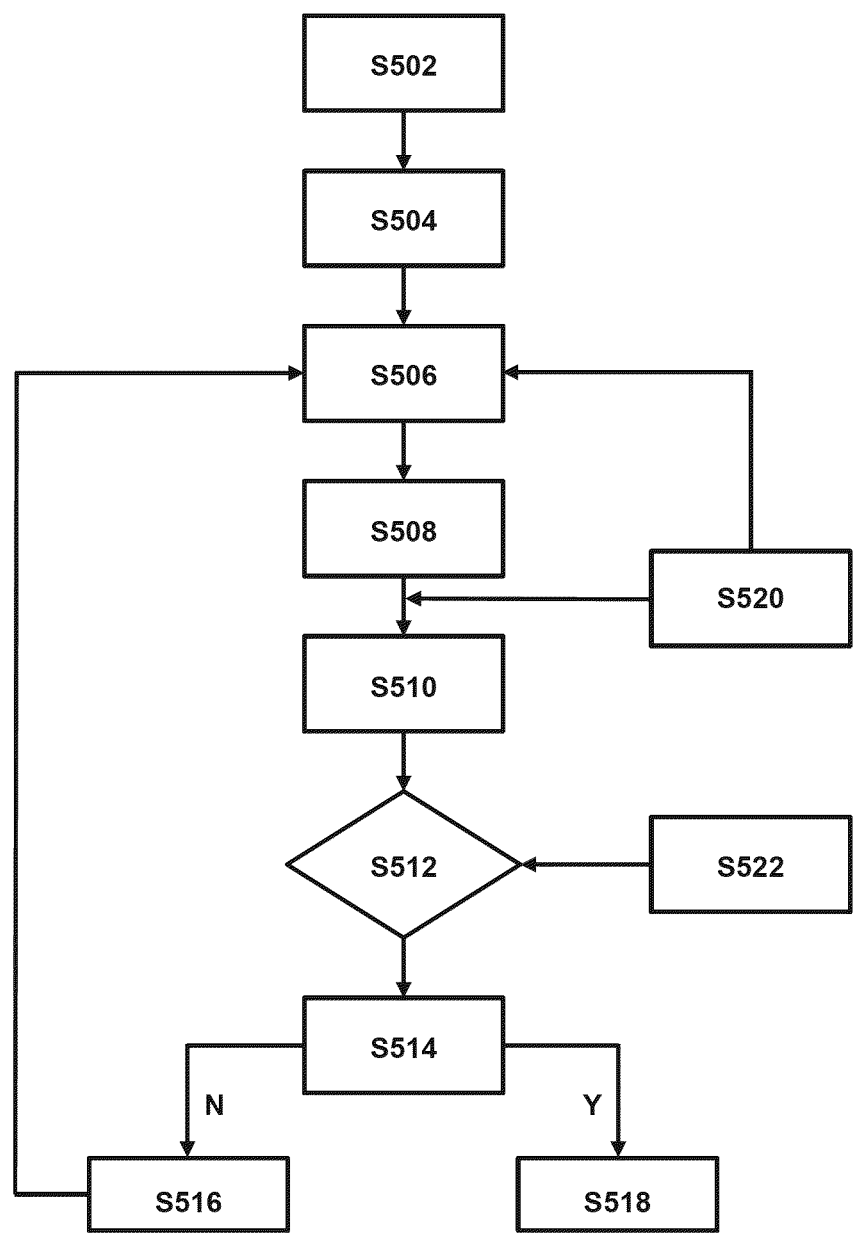
FIG. 12A, FIG. 12B and FIG. 13 show example flowcharts of various optimization processes, according to an embodiment of the present disclosure.

FIG. 12A shows one exemplary method of optimization, where a cost function is minimized or maximized. In step S502, initial values of one or more design variables are obtained, including one or more associated tuning ranges, if any. In step S504, the multi-variable cost function is set up. In step S506, the cost function is expanded within a small enough neighborhood around the starting point value of the one or more design variables for the first iterative step (i=0). In step S508, standard multi-variable optimization techniques are applied to the cost function. Note that the optimization problem can apply constraints, such as the one or more tuning ranges, during the optimization process in S508 or at a later stage in the optimization process. Step S520 indicates that each iteration is done for the one or more given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, then the final value of the design variables is outputted in step S518. The output step may also include outputting one or more other functions using the final values of the design variables, such as outputting a wavefront aberration-adjusted map at the pupil plane (or other planes), an optimized illumination map, and/or optimized design layout etc. If the termination condition is not satisfied, then in step S516, the values of the one or more design variables is updated with the result of the i-th iteration, and the process goes back to step S506. The process of FIG. 12A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n}, \ (n = 1, 2, \ldots N) \ \text{exist}),$$

which is generally valid in a lithographic projection apparatus. An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \tag{Eq. 3}$$
$$\sum_{n=1}^{N} \frac{\partial f_p(z_1, z_2, \ldots, z_N)}{\partial z_n}|_{z_1=z_{1i}, z_2=z_{2i}, \ldots z_N=z_{Ni}}(z_n = z_{ni})$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \tag{Eq. 4}$$
$$\sum_{p=1}^{P} w_p \Bigg( f_p(z_{1i}, z_{2i}, \ldots, z_{Ni}) +$$
$$\sum_{n=1}^{N} \frac{\partial f_p(z_1, z_2, \ldots, z_N)}{\partial z_n}|_{z_1=z_{1i}, z_2=z_{2i}, \ldots z_N=z_{Ni}}(z_n = z_{ni}) \Bigg)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = 0, \text{wherein } n = 1, 2, \ldots, N.$$

If the design variables $(z_1, z_2, \ldots, z_N)$ are under constraints in the form of J inequalities (e.g. tuning ranges of $(z_1, z_2, \ldots, z_N)$)

$$\sum_{n=1}^{N} A_{nj} z_n \le B_j,$$

for j=1, 2, . . . , J; and K equalities (e.g. interdependence between the design variables)

$$\sum_{n=1}^{N} C_{nk} z_n \le D_k,$$

for k=1, 2, . . . , K, the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \le z_n \le z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \le p \le P} \frac{f_p(z_1, z_2, \ldots, z_N)}{CL_p} \tag{Eq. 5}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \qquad \text{(Eq. 6)}$$

wherein q is an even positive integer such as at least 4, or at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for p=1, . . . P, $$\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_n \leq \qquad \text{(Eq. 6')}$$

$$E_{Up} + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_{ni} -$$

$$f_p(z_{1i}, z_{2i}, \ldots, z_{Ni})$$

and $$-\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_n \leq \qquad \text{(Eq. 6'')}$$

$$-E_{Up} - \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_{ni} +$$

$$f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \qquad \text{(Eq. 6''')}$$

$$(1-\lambda)\sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as, for example, a set of focus, dose, aberration, laser bandwidth (e.g. E95 or ($\lambda$ min to $\lambda$ max) and fare specific to intensity values for which the resist image is within a certain limit of the design target of the resist image. Note that all the methods discussed here may also be extended to a generalized process window definition that can be established by different or additional base parameters than exposure dose and defocus. These may include, but are not limited to, optical settings such as NA, sigma, aberration, polarization, or an optical constant of the resist layer. For example, as described earlier, if the process window (PW) also comprises different patterning device pattern bias (mask bias), then the optimization includes the minimization of Mask Error Enhancement Factor (MEEF), which is defined as the ratio between the substrate edge placement error (EPE) and the induced patterning device pattern edge bias. The process window defined on focus and dose values only serve as an example in this disclosure.

A method of maximizing a process window using, for example, dose and focus as its parameters, according to an embodiment, is described below. In a first step, starting from a known condition ($f_0$, $\varepsilon_0$) in the process window, wherein $f_0$ is a nominal focus and $\varepsilon_0$ is a nominal dose, minimizing one of the cost functions below in the vicinity ($f_0 \pm \Delta f$, $\varepsilon_0 \pm \varepsilon$):

$$CF(z_1, z_2, \ldots, z_N, f_0, \varepsilon_0) = \qquad \text{(Eq. 7)}$$

$$\max_{(f,\varepsilon)=(f_0\pm\Delta f, \varepsilon_0\pm\varepsilon)} \max_{p} |f_p(z_1, z_2, \ldots, z_N, f, \varepsilon)|$$

or $$CF(z_1, z_2, \ldots, z_N, f_0, \varepsilon_0) = \qquad \text{(Eq. 7')}$$

$$\sum_{(f,\varepsilon)=(f_0\pm\Delta f, \varepsilon_0\pm\varepsilon)} \sum_{p} w_p f_p^2(z_1, z_2, \ldots, z_N, f, \varepsilon)$$

or

-continued $$CF(z_1, z_2, \ldots, z_N, f_0, \varepsilon_0) = \qquad \text{(Eq. 7'')}$$

$$(1 - \lambda) \sum_{(f,\varepsilon)=(f_0 \pm \Delta f, \varepsilon_0 \pm \varepsilon)} \sum_p w_p f_p^2(z_1, z_2, \ldots, z_N, f, \varepsilon) +$$

$$\lambda \max_{(f,\varepsilon)=(f_0 \pm \Delta f, \varepsilon_0 \pm \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

If the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7''. If the design variables represent one or more characteristics of the projection optics, such as the Zernike coefficients, then minimizing the cost functions of Eqs. 7, 7', or 7'' leads to process window maximization based on projection optics optimization, i.e., LO. If the design variables represent one or more characteristics of the illumination and patterning device in addition to those of the projection optics, then minimizing the cost function of Eqs. 7, 7', or 7'' leads to process window maximizing based on SMLO, as illustrated in FIG. 10. If the design variables represented one or more characteristics of the source and patterning device, then minimizing the cost functions of Eqs. 7, 7', or 7'' leads to process window maximization based on SMO. The cost functions of Eqs. 7, 7', or 7'' can also include at least one $f_p(z_1, z_2, \ldots, z_N)$ such as described herein, that is a function of the bandwidth.

Figure 13:
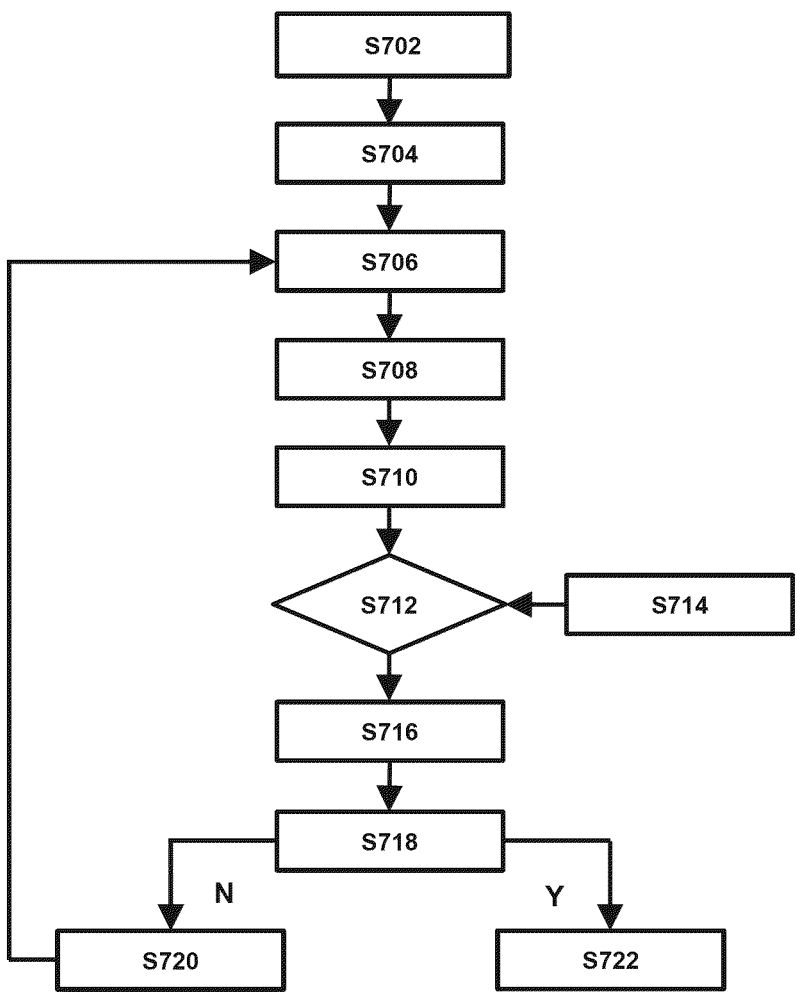

FIG. 13 shows one specific example of how a simultaneous SMLO process can use a gradient based optimization (e.g. quasi newton, or Gauss Newton Algorithm). In step S702, starting values of one or more design variables are identified. A tuning range for each variable may also be identified. In step S704, the cost function is defined using the one or more design variables. In step S706, the cost function is expanded around the starting values for all evaluation points in the design layout. In step S708, a suitable optimization technique is applied to minimize or maximize the cost function. In optional step S710, a full-chip simulation is executed to cover all critical patterns in a full-chip design layout. A desired lithographic response metric (such as CD, EPE, or EPE and PPE) is obtained in step S714, and compared with predicted values of those quantities in step S712. In step S716, a process window is determined. Steps S718, S720, and S722 are similar to corresponding steps S514, S516 and S518, as described with respect to FIG. 12A. As mentioned before, the final output may be, for example, a wavefront aberration map in the pupil plane, optimized to produce the desired imaging performance. The final output may be, for example, an optimized illumination map and/or an optimized design layout.

Figure 12B:
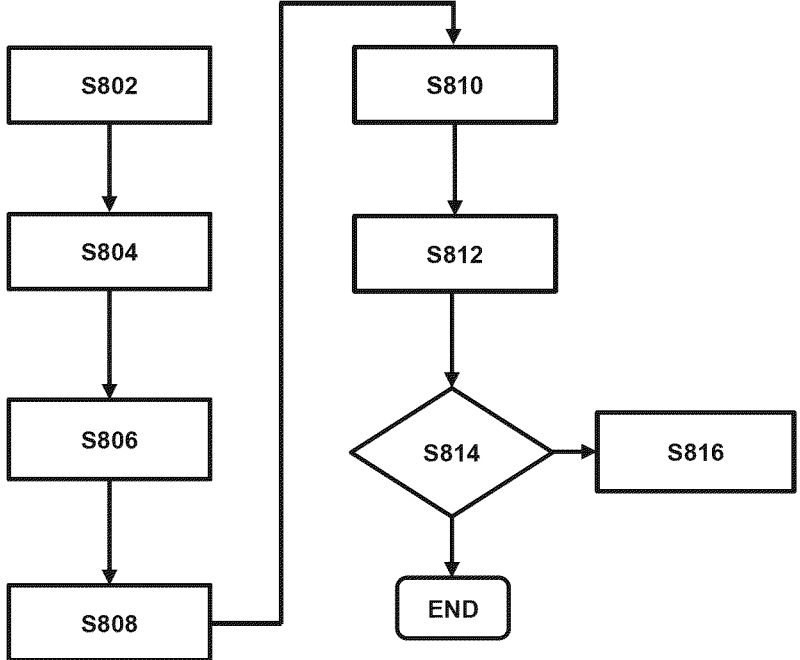

FIG. 12B shows an exemplary method to optimize the cost function where the design variables $(z_1, z_2, \ldots, z_N)$ include design variables that may only assume discrete values.

The method starts by defining the pixel groups of the illumination and the patterning device tiles of the patterning device (step S802). Generally, a pixel group or a patterning device tile may also be referred to as a division of a lithographic process component. In one exemplary approach, the illumination is divided into 117 pixel groups, and 94 patterning device tiles are defined for the patterning device, substantially as described above, resulting in a total of 211 divisions.

In step S804, a lithographic model is selected as the basis for lithographic simulation. A lithographic simulation produces results that are used in calculations of one or more lithographic metrics, or responses. A particular lithographic metric is defined to be the performance metric that is to be optimized (step S806). In step S808, the initial (pre-optimization) conditions for the illumination and the patterning device are set up. Initial conditions include initial states for the pixel groups of the illumination and the patterning device tiles of the patterning device such that references may be made to an initial illumination shape and an initial patterning device pattern. Initial conditions may also include patterning device pattern bias (sometimes referred to as mask bias), NA, and/or focus ramp range. Although steps S802, S804, S806, and S808 are depicted as sequential steps, it will be appreciated that in other embodiments, these steps may be performed in other sequences.

In step S810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination higher), and/or according to how an alteration of the pixel group or patterning device tile affects the performance metric.

Once the pixel groups and patterning device tiles are ranked, the illumination and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an embodiment, the interleaved simultaneous optimization procedure may include altering a pixel group of the illumination and if an improvement of the performance metric is found, the dose or intensity is stepped up and/or down to look for further improvement. In a further embodiment, the stepping up and/or down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include a $f_p(z_1, z_2, \ldots, z_N)$ that is a function of the exposure time. In an embodiment, optimization of such a cost function is constrained or influenced by a measure of the bandwidth or other metric.

Figure 14:
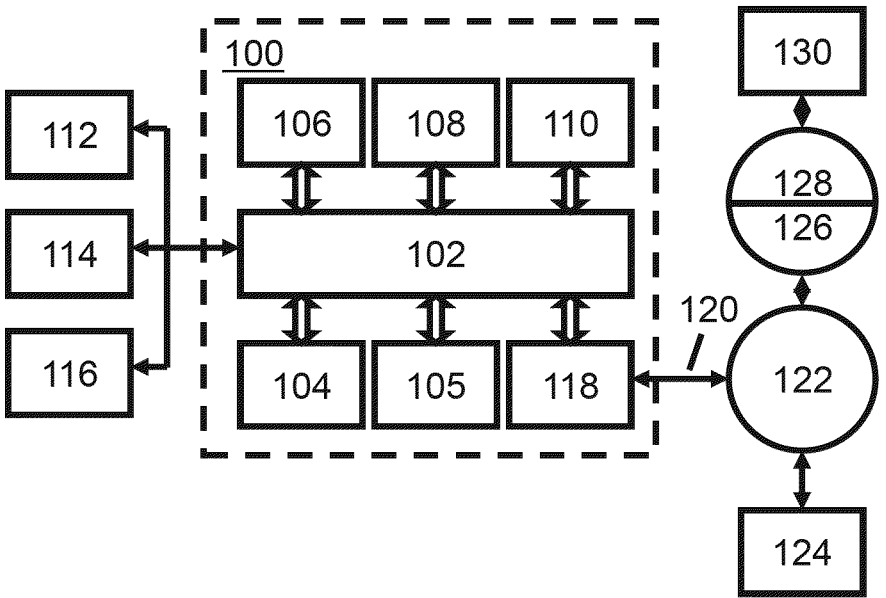
FIG. 14 is a block diagram of an example computer system, according to an embodiment of the present disclosure.

FIG. 14 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 15:
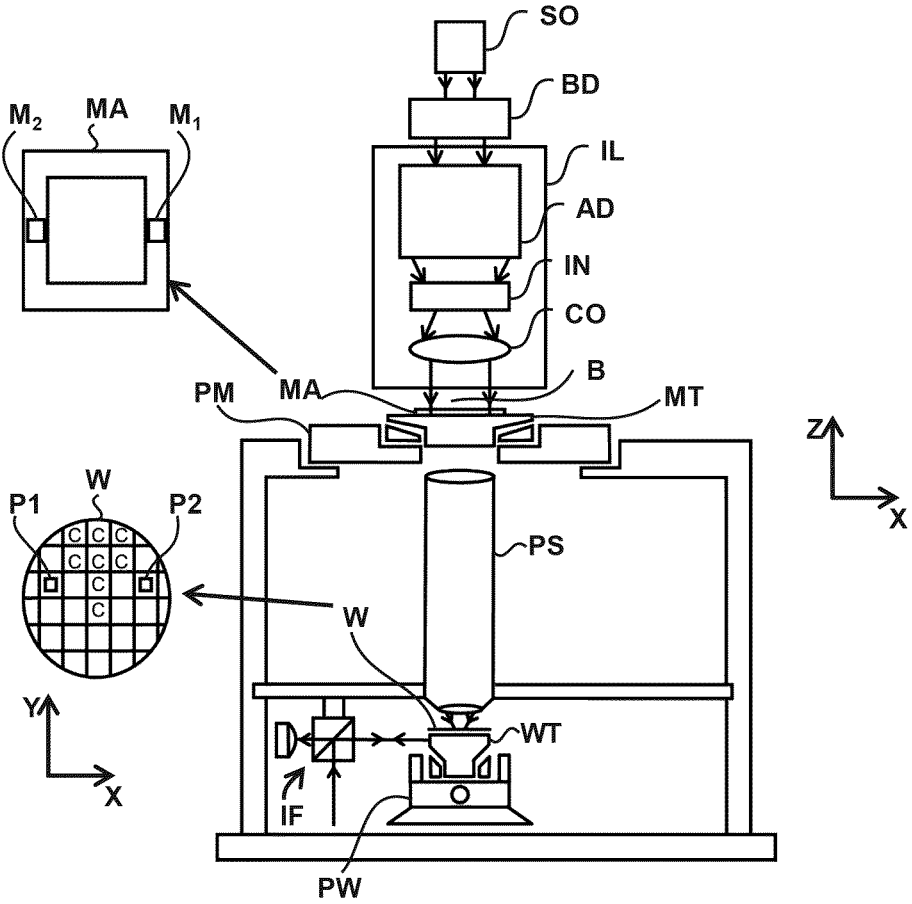
FIG. 15 is a schematic diagram of a lithographic projection apparatus, according to an embodiment of the present disclosure.

FIG. 15 schematically depicts an exemplary lithographic projection apparatus whose illumination could be optimized utilizing the methods described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
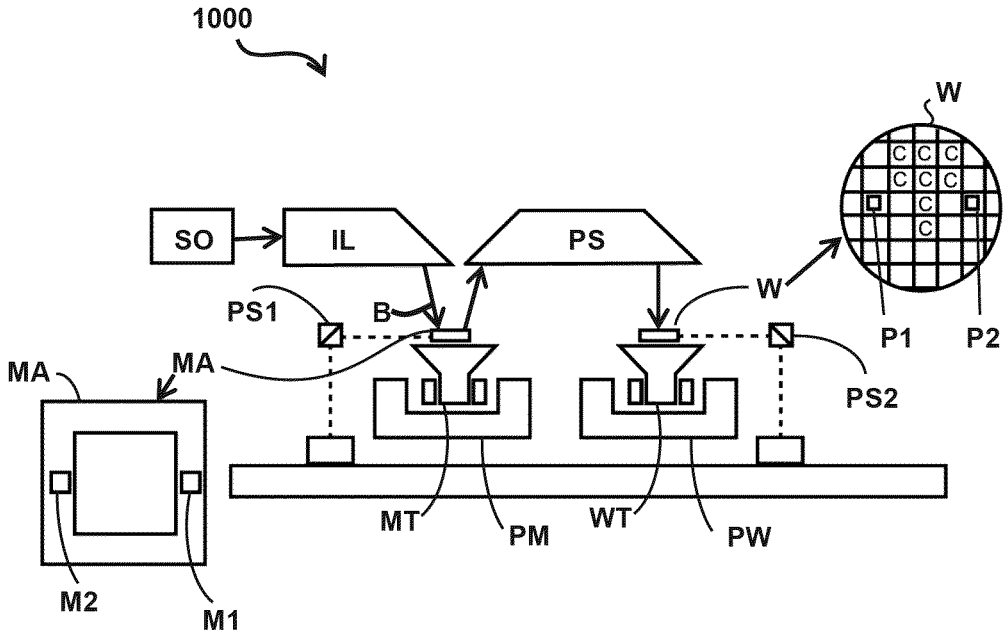
FIG. 16 is a schematic diagram of another lithographic projection apparatus, according to an embodiment of the present disclosure.

FIG. 16 schematically depicts another exemplary lithographic projection apparatus 1000 whose illumination could be optimized utilizing the methods described herein.

The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
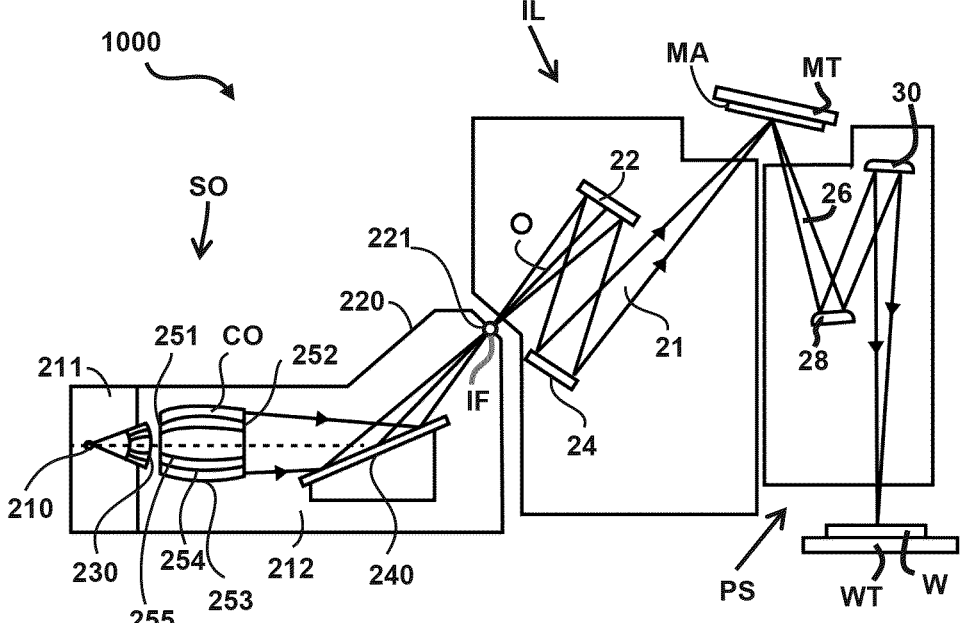
FIG. 17 is a more detailed view of the apparatus in FIG. 16, according to an embodiment of the present disclosure.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
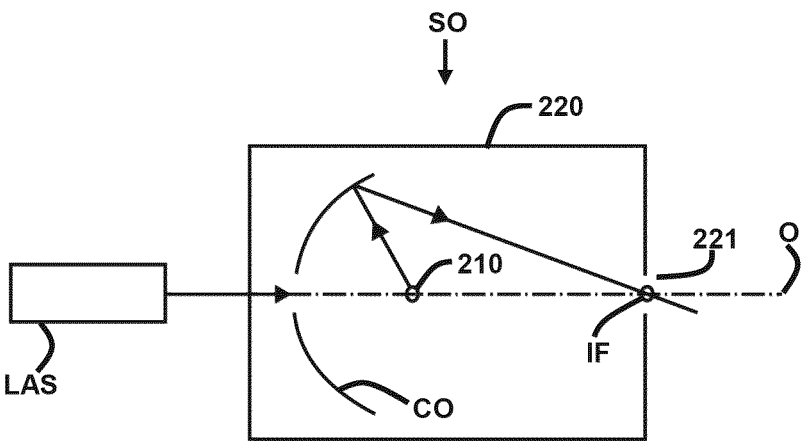
FIG. 18 is a more detailed view of the source collector module SO of the apparatus of FIG. 16 and FIG. 17, according to an embodiment of the present disclosure.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The embodiments may further be described using the following clauses:

1. A non-transitory computer-readable medium for improving a lithographic process of imaging a portion of a design layout onto a substrate using a lithographic apparatus, the medium comprising instructions stored therein that, when executed by one or more processors, cause operations comprising:
   computing a multi-variable cost function, the multi-variable cost function being a function of: (i) a plurality of design variables that affect characteristics of the lithographic process and (ii) a radiation bandwidth of a radiation source of the lithographic apparatus; and
   reconfiguring one or more of the characteristics of the lithographic process by adjusting one or more of the design variables until a termination condition is satisfied, the termination condition including a speckle characteristic being within a speckle specification associated with the radiation generation by the radiation source, while maintaining an image contrast associated with the lithographic process within a desired range, the speckle characteristic being a function of the radiation bandwidth.

2. The medium of clause 1, wherein the radiation bandwidth changes during the reconfiguration.

3. The medium of any of preceding clauses, wherein the speckle characteristic is a metric associated with a speckle produced by mutual interference of a set of coherent wavefronts of the radiation source, the speckle indicative of local dose variations.

4. The medium of any of preceding clauses, wherein the speckle characteristic is a speckle contrast associated with the radiation generated by the radiation source, and wherein the speckle contrast is reduced or minimized during reconfiguration.

5. The medium of clause 4, wherein the speckle contrast associated with the radiation is characterized by contribution from both spatial coherence and temporal coherence, and reduction of the speckle contrast comprises reducing temporal coherence and/or spatial coherence.

6. The medium of clause 5, wherein the speckle contrast is computed by:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}}$$

wherein, $\lambda$ is the wavelength of the radiation, $A_{beam}$ is a source size, $\Omega_{divergence}$ is a source divergence, TIS is a pulse duration, and BW is the bandwidth.

7. The medium of any of preceding clauses, wherein the characteristics comprises one or more of:
   the image contrast of an image produced during the lithographic process;
   a process window of the lithographic process;
   a source characteristics;
   a performance indicator associated with the lithographic process; or the speckle characteristic and a range of bandwidth of the radiation source.

8. The medium of any of preceding clauses, wherein reconfiguring the one or more of the characteristics of the lithographic process comprises:
   performing, via one or more process models associated with the lithographic process, a source optimization using the multi-variate cost function.

9. The medium of any of preceding clauses, wherein reconfiguring the one or more of the characteristics of the lithographic process comprises:
   performing, via one or more process models associated with the lithographic process, a source mask co-optimization using the multi-variate cost function.

10. The medium of any of preceding clauses, wherein the radiation bandwidth is a full width at half maximum (FWHM) bandwidth.

11. The medium of any of preceding clauses, wherein the radiation bandwidth is an E95 bandwidth.

12. The medium of any of preceding clauses, wherein the radiation bandwidth is increased to a value greater than a minimum that hardware of the source allows.

13. The medium of any of preceding clauses, wherein reconfiguring the one or more of the characteristics of the lithographic process maintains the image contrast associated the portion of the design layout within a desired range of best image contrast.

14. The medium of any of preceding clauses, wherein reconfiguring the one or more of the characteristics of the lithographic process increases latitude of at least one of the design variables.

15. The medium of clause 14, wherein the latitude is depth of focus or exposure latitude.

16. The medium of any of preceding clauses, wherein reconfiguring the one or more of the characteristics of the lithographic process increases a size of a process window.

17. The medium of any of preceding clauses, wherein reconfiguring the one or more of the characteristics of the lithographic process optimizes the radiation bandwidth of the radiation source until the termination condition is satisfied.

18. The medium of any of preceding clauses, wherein reconfiguring the one or more of the characteristics of the lithographic process is an iterative process, each iteration comprising:

(i) simulating, by perturbing the one or more design variables, one or more process models associated with the lithographic process;

(ii) computing the multi-variate cost function using values of the design variables and simulation results;

(iii) determining based on the multi-variate cost function whether the termination condition is satisfied; and (iv) responsive to the termination condition not being satisfied, further perturbing the one or more design variables and performing steps (i)-(iv).

19. The medium of any of preceding clauses, wherein the cost function is one or more selected from the following: edge placement error, pattern placement error, critical dimension (CD), a local CD uniformity as a function of the speckle characteristic, resist contour distance, worst defect size, best focus shift, or mask rule check.

20. The medium of any of preceding clauses, wherein the portion of the design layout comprises one or more selected from the following: an entire design layout, a clip, a section of a design layout that is known to have a critical feature, a section of the design layout where a hot spot or a warm spot has been identified, or a section of the design layout where a critical feature has been identified.

21. The medium of any of preceding clauses, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process.

22. The medium of any of preceding clauses, wherein the design variables comprises one or more variables associated with:

an illumination of the lithographic apparatus;

geometric properties of the design layout;

projection optics of the lithographic apparatus;

a resist of the substrate; or an aerial image or a resist image generated during the lithographic process.

23. The medium of clause 22, wherein the aerial image or the resist image is a simulated image.

24. The medium of any of preceding clauses, wherein the cost function is minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

25. The medium of any of clauses 1-23, wherein the radiation source is a component of the lithographic apparatus that generates the radiation used in the lithographic process.

26. The medium of any of clauses 1-23, wherein the radiation source is a radiation source model configured to mimic the radiation used in the lithographic process.

27. The medium of any of preceding clauses, wherein the radiation bandwidth is characterized by at least one of:

a range of radiation bandwidth;

a function of a variable that is a function of the bandwidth; or a function of a variable that affects the bandwidth, the variable being a function of one or more of a plurality of design variables that represent one or more characteristics of the lithographic process.

28. A method for improving a lithographic process of imaging a portion of a design layout onto a substrate using a lithographic apparatus, the method comprising:

computing, by a hardware computer system, a multi-variable cost function, the multi-variable cost function being a function of: (i) a plurality of design variables that affect characteristics of the lithographic process and (ii) a radiation bandwidth of a radiation source of the lithographic apparatus; and reconfiguring, by the hardware computer system, one or more of the characteristics of the lithographic process by adjusting one or more of the design variables until a termination condition is satisfied, the termination condition including a speckle characteristic being within a speckle specification associated with the radiation generation by the radiation source, while maintaining an image contrast associated with the lithographic process within a desired range, the speckle characteristic being a function of the radiation bandwidth.

29. The method of clause 28, wherein the radiation bandwidth changes during the reconfiguration.

30. The method of any of preceding clauses, wherein the speckle characteristic is a metric associated with a speckle produced by mutual interference of a set of coherent wavefronts of the radiation source, the speckle indicative of local dose variations.

31. The method of any of preceding clauses, wherein the speckle characteristic is a speckle contrast associated with the radiation generated by the radiation source, and wherein the speckle contrast is reduced or minimized during reconfiguration.

32. The method of clause 31, wherein the speckle contrast associated with the radiation is characterized by contribution from both spatial coherence and temporal coherence, and reduction of the speckle contrast comprises reducing temporal coherence and/or spatial coherence.

33. The method of clause 32, wherein the speckle contrast is computed by:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}}$$

wherein, $\lambda$ is the wavelength of the radiation, $A_{beam}$ is a source size, $\Omega_{divergence}$ is a source divergence, TIS is a pulse duration, and BW is the bandwidth.

34. The method of any of preceding clauses, wherein the characteristics comprises one or more of:

the image contrast of an image produced during the lithographic process;

a process window of the lithographic process;

a source characteristics;

a performance indicator associated with the lithographic process; or the speckle characteristic and a range of bandwidth of the radiation source.

35. The method of any of preceding clauses, wherein reconfiguring the one or more of the characteristics of the lithographic process comprises:

performing, via one or more process models associated with the lithographic process, a source optimization using the multi-variate cost function; or performing, via one or more process models associated with the lithographic process, a source mask co-optimization using the multi-variate cost function.

36. The method of any of preceding clauses, wherein the radiation bandwidth is a full width at half maximum (FWHM) bandwidth.

37. The method of any of preceding clauses, wherein the radiation bandwidth is an E95 bandwidth.

38. The method of any of preceding clauses, wherein the radiation bandwidth is increased to a value greater than a minimum that hardware of the source allows.

39. The method of any of preceding clauses, wherein reconfiguring the one or more of the characteristics of the lithographic process maintains the image contrast associated the portion of the design layout within a desired range of best image contrast.

40. The method of any of preceding clauses, wherein reconfiguring the one or more of the characteristics of the lithographic process increases latitude of at least one of the design variables.

41. The method of clause 40, wherein the latitude is depth of focus or exposure latitude.

42. The method of any of preceding clauses, wherein reconfiguring the one or more of the characteristics of the lithographic process increases a size of a process window.

43. The method of any of preceding clauses, wherein reconfiguring the one or more of the characteristics of the lithographic process optimizes the radiation bandwidth of the radiation source until the termination condition is satisfied.

44. The method of any of preceding clauses, wherein reconfiguring the one or more of the characteristics of the lithographic process is an iterative process, each iteration comprising:

(i) simulating, by perturbing the one or more design variables, one or more process models associated with the lithographic process;

(ii) computing the multi-variate cost function using values of the design variables and simulation results;

(iii) determining based on the multi-variate cost function whether the termination condition is satisfied; and (iv) responsive to the termination condition not being satisfied, further perturbing the one or more design variables and performing steps (i)-(iv).

45. The method of any of preceding clauses, wherein the cost function is one or more selected from the following: edge placement error, pattern placement error, critical dimension (CD), a local CD uniformity as a function of the speckle characteristic, resist contour distance, worst defect size, best focus shift, or mask rule check.

46. The method of any of preceding clauses, wherein the portion of the design layout comprises one or more selected from the following: an entire design layout, a clip, a section of a design layout that is known to have a critical feature, a section of the design layout where a hot spot or a warm spot has been identified, or a section of the design layout where a critical feature has been identified.

47. The method of any of preceding clauses, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process.

48. The method of any of preceding clauses, wherein the design variables comprises one or more variables associated with:

an illumination of the lithographic apparatus;

geometric properties of the design layout;

projection optics of the lithographic apparatus;

a resist of the substrate; or an aerial image or a resist image generated during the lithographic process.

49. The method of clause 48, wherein the aerial image or the resist image is a simulated image.

50. The method of any of preceding clauses, wherein the cost function is minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

51. The method of any of clauses 27-50, wherein the radiation source is a component of the lithographic apparatus that generates the radiation used in the lithographic process.

52. The method of any of clauses 27-50, wherein the radiation source is a radiation source model configured to mimic the radiation used in the lithographic process.

53. The method of any of preceding clauses, wherein the radiation bandwidth is characterized by at least one of:

a range of radiation bandwidth;

a function of a variable that is a function of the bandwidth; or a function of a variable that affects the bandwidth, the variable being a function of one or more of a plurality of design variables that represent one or more characteristics of the lithographic process.

54. A method for determining optimal radiation bandwidth to improve a lithographic process of imaging a portion of a design layout onto a substrate using a lithographic apparatus, the method comprising:

computing, by a hardware computer system, a multi-variable cost function, the multi-variable cost function being a function of: (i) a plurality of design variables that affect characteristics of the lithographic process and (ii) a radiation bandwidth of a radiation source of the lithographic apparatus; and determining, by the hardware computer system, an optimal radiation bandwidth by adjusting one or more design variables until a termination condition is satisfied, the termination condition including a speckle characteristic being within a speckle specification associated with the radiation generation by the radiation source, while maintaining an image contrast associated with the lithographic process within a desired range, the speckle characteristic being a function of the radiation bandwidth.

55. The method of clause 54, wherein the speckle characteristic is a metric associated with a speckle produced by mutual interference of a set of coherent wavefronts of the radiation source, the speckle indicative of local dose variations.

56. The method of any of preceding clauses, wherein the speckle characteristic is a speckle contrast associated with the radiation generated by the radiation source, and wherein the speckle contrast is caused to reduce or minimize during determination of the optimal bandwidth.

57. The method of clause 56, wherein the speckle contrast associated with the radiation is characterized by contribution from both spatial coherence and temporal coherence, and reduction of the speckle contrast comprises reducing temporal coherence and/or spatial coherence.

58. The method of clause 57, wherein the speckle contrast is computed by:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}}$$

wherein, $\lambda$ is the wavelength of the radiation, $A_{beam}$ is a source size, $\Omega_{divergence}$ is a source divergence, TIS is a pulse duration, and BW is the bandwidth.

59. The method of any of preceding clauses, wherein the cost function is one or more selected from the following: edge placement error, pattern placement error, critical dimension (CD), a local CD uniformity as a function of the speckle characteristic, resist contour distance, worst defect size, best focus shift, or mask rule check.

60. The method of any of preceding clauses, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process.

61. The method of any of preceding clauses, wherein the design variables comprises one or more variables associated with:

an illumination of the lithographic apparatus;

geometric properties of the design layout;

projection optics of the lithographic apparatus;

a resist of the substrate; or an aerial image or a resist image generated during the lithographic process.

62. A non-transitory computer-readable medium for determining optimal radiation bandwidth to improve a lithographic process of imaging a portion of a design layout onto a substrate using a lithographic apparatus, the medium comprising instructions stored therein that, when executed by one or more processors, cause operations comprising:

computing a multi-variable cost function, the multi-variable cost function being a function of: (i) a plurality of design variables that affect characteristics of the lithographic process and (ii) a radiation bandwidth of a radiation source of the lithographic apparatus; and determining an optimal radiation bandwidth by adjusting one or more design variables until a termination condition is satisfied, the termination condition including a speckle characteristic being within a speckle specification associated with the radiation generation by the radiation source, while maintaining an image contrast associated with the lithographic process within a desired range, the speckle characteristic being a function of the radiation bandwidth.

63. The medium of clause 62, wherein the speckle characteristic is a metric associated with a speckle produced by mutual interference of a set of coherent wavefronts of the radiation source, the speckle indicative of local dose variations.

64. The medium of any of preceding clauses, wherein the speckle characteristic is a speckle contrast associated with the radiation generated by the radiation source, and wherein the speckle contrast is caused to reduce or minimize during determination of the optimal bandwidth.

65. The medium of clause 64, wherein the speckle contrast associated with the radiation is characterized by contribution from both spatial coherence and temporal coherence, and reduction of the speckle contrast comprises reducing temporal coherence and/or spatial coherence.

66. The medium of clause 65, wherein the speckle contrast is computed by:

$$\text{Speckle Contrast} = \sqrt{\frac{\lambda^2}{A_{beam} \cdot \Omega_{divergence}} + \frac{1}{TIS} \cdot \frac{\lambda^2}{c \cdot BW}}$$

wherein, $\lambda$ is the wavelength of the radiation, $A_{beam}$ is a source size, $\Omega_{divergence}$ is a source divergence, TIS is a pulse duration, and BW is the bandwidth.

67. The medium of any of preceding clauses, wherein the cost function is one or more selected from the following: edge placement error, pattern placement error, critical dimension (CD), a local CD uniformity as a function of the speckle characteristic, resist contour distance, worst defect size, best focus shift, or mask rule check.

68. The medium of any of preceding clauses, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; or minimizing an exposure time in the lithographic process.

69. The medium of any of preceding clauses, wherein the design variables comprises one or more variables associated with:

an illumination of the lithographic apparatus;

geometric properties of the design layout;

projection optics of the lithographic apparatus;

a resist of the substrate; or an aerial image or a resist image generated during the lithographic process.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The word "or" should not be considered as excluding any combination of the listed items unless the context requires it.

The descriptions above are intended to be illustrative, not limiting. Thus, it will be apparent to one skilled in the art that modifications may be made as described without departing from the scope of the claims set out below.

The invention claimed is:

1. A method for improving a lithographic process of imaging a portion of a design layout onto a substrate using a lithographic apparatus, the method comprising:

computing, by a hardware computer system, a multi-variable cost function, the multi-variable cost function being a function of: (i) a plurality of design variables that affect characteristics of the lithographic process and (ii) a radiation bandwidth of a radiation source of the lithographic apparatus; and reconfiguring, by the hardware computer system, one or more of the characteristics of the lithographic process by adjusting one or more of the design variables to reduce or minimize a speckle characteristic associated with the radiation generation by the radiation source, while maintaining an image contrast associated with the lithographic process within a desired range, wherein the speckle characteristic is reduced by increase of the radiation bandwidth.

2. The method of claim 1, wherein the speckle characteristic is a metric associated with a speckle produced by mutual interference of a set of coherent wavefronts of the radiation source, the speckle indicative of local dose variations.

3. The method of claim 1, wherein the speckle characteristic is a speckle contrast associated with the radiation generated by the radiation source.

4. The method of claim 3, wherein the speckle contrast associated with the radiation is characterized by contribution from both spatial coherence and temporal coherence, and reduction of the speckle contrast comprises reducing temporal coherence and/or spatial coherence.

5. The method of claim 1, wherein the characteristics comprises one or more selected from:

the image contrast of an image produced during the lithographic process;

a process window of the lithographic process;

an illumination characteristic;

a performance indicator associated with the lithographic process; or the speckle characteristic and a range of bandwidth of the radiation source.

6. The method of claim 1, wherein reconfiguring the one or more of the characteristics of the lithographic process comprises:

performing, via one or more process models associated with the lithographic process, an illumination optimization using the multi-variate cost function; or performing, via one or more process models associated with the lithographic process, an illumination mask co-optimization using the multi-variate cost function.

7. The method of claim 1, wherein the radiation bandwidth is a full width at half maximum (FWHM) bandwidth.

8. The method of claim 1, wherein the radiation bandwidth is an E95 bandwidth.

9. The method of claim 1, wherein the radiation bandwidth is increased to a value greater than a minimum that hardware of the radiation source allows.

10. The method of claim 1, wherein reconfiguring the one or more of the characteristics of the lithographic process maintains the image contrast associated with the portion of the design layout within a desired range of best image contrast.

11. The method of claim 1, wherein reconfiguring the one or more of the characteristics of the lithographic process increases latitude of at least one of the design variables.

12. The method of claim 1, wherein reconfiguring the one or more of the characteristics of the lithographic process optimizes the radiation bandwidth of the radiation source.

13. The method of claim 1, wherein reconfiguring the one or more of the characteristics of the lithographic process comprises:

(i) performing a simulation using the one or more design variables with one or more process models associated with the lithographic process;

(ii) computing the multi-variate cost function using values of the design variables and simulation results; and (iii) perturbing the one or more design variables and performing steps (i)-(iii) using the perturbed one or more design variables.

14. The method of claim 1, wherein the cost function is based on one or more selected from: edge placement error, pattern placement error, critical dimension (CD), a local CD uniformity as a function of the speckle characteristic, resist contour distance, worst defect size, best focus shift, or mask rule check.

15. A non-transitory computer-readable medium comprising instructions stored therein that, when executed by one or more processors, are configured to cause the one or more processors to at least:

compute a multi-variable cost function, the multi-variable cost function being a function of: (i) a plurality of design variables that affect characteristics of a lithographic process of imaging a portion of a design layout onto a substrate using a lithographic apparatus and (ii) a radiation bandwidth of a radiation source of the lithographic apparatus; and reconfigure one or more of the characteristics of the lithographic process by adjusting one or more of the design variables to reduce or minimize a speckle characteristic associated with the radiation generation by the radiation source, while maintaining an image contrast associated with the lithographic process within a desired range, the speckle characteristic is reduced by increase of the radiation bandwidth.

16. The non-transitory computer-readable medium of claim 15, wherein the speckle characteristic is a metric associated with a speckle produced by mutual interference of a set of coherent wavefronts of the radiation source or the speckle characteristic is a speckle contrast associated with the radiation generated by the radiation source.

17. A method comprising:

computing, by a hardware computer system, a multi-variable cost function, the multi-variable cost function being a function of: (i) a plurality of design variables that affect characteristics of a lithographic process of imaging a portion of a design layout onto a substrate using a lithographic apparatus and (ii) a radiation bandwidth of a radiation source of the lithographic apparatus; and determining, by the hardware computer system, an optimal radiation bandwidth to improve the lithographic process by adjusting one or more design variables until a termination condition is satisfied, the termination condition including a speckle characteristic being within a speckle specification associated with the radiation generation by the radiation source, while maintaining an image contrast associated with the lithographic process within a desired range, the speckle characteristic being reduced by increase of the radiation bandwidth.

18. The method of claim 17, wherein the speckle characteristic is a metric associated with a speckle produced by mutual interference of a set of coherent wavefronts of the radiation source, the speckle indicative of local dose variations.

19. The method of claim 17, wherein the speckle characteristic is a speckle contrast associated with the radiation generated by the radiation source, and wherein the speckle contrast is caused to reduce or minimize during determination of the optimal bandwidth.

20. A non-transitory computer-readable medium comprising instructions stored therein that, when executed by one or more processors, are configured to cause the one or more processors to at least:

compute a multi-variable cost function, the multi-variable cost function being a function of: (i) a plurality of design variables that affect characteristics of a lithographic process of imaging a portion of a design layout onto a substrate using a lithographic apparatus and (ii) a radiation bandwidth of a radiation source of the lithographic apparatus; and determine an optimal radiation bandwidth to improve the lithographic process by adjusting one or more design variables until a termination condition is satisfied, the termination condition including a speckle characteristic being within a speckle specification associated with the radiation generation by the radiation source, while maintaining an image contrast associated with the lithographic process within a desired range, the speckle characteristic being reduced by increase of the radiation bandwidth.

\* \* \* \* \*